United States Patent
Takinami et al.

(10) Patent No.: US 6,930,562 B2
(45) Date of Patent: Aug. 16, 2005

(54) OSCILLATION WITH MULTIPLE SERIES CIRCUITS IN PARALLEL

(75) Inventors: Koji Takinami, Osaka (JP); Hisashi Adachi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 89 days.

(21) Appl. No.: 10/620,203

(22) Filed: Jul. 15, 2003

(65) Prior Publication Data

US 2004/0066244 A1 Apr. 8, 2004

(30) Foreign Application Priority Data

Jul. 16, 2002 (JP) ........................... 2002-207400

(51) Int. Cl.$^7$ ................................. H03B 5/12
(52) U.S. Cl. ..................... 331/117 R; 331/36 C
(58) Field of Search .................. 331/117 R, 36 C, 331/177 V, 1 A; 327/156, 147

(56) References Cited

U.S. PATENT DOCUMENTS

| | | | | |
|---|---|---|---|---|
| 5,422,603 A | * | 6/1995 | Soyuer | 331/1 A |
| 5,434,545 A | * | 7/1995 | Burchfield | 331/143 |
| 5,781,048 A | * | 7/1998 | Nakao et al. | 327/157 |
| 6,292,065 B1 | | 9/2001 | Friedman et al. | |

FOREIGN PATENT DOCUMENTS

JP     2000-224027 A     8/2000

OTHER PUBLICATIONS

Li Lin et al., "A 1.4GHx Differential Low–Noise CMOS Frequency Synthesizer using a Wideband PLL Architecture", Digest of Technical Papers, 2000 IEEE International Solid–State Circuits Conference, pp. 204 and 205.

* cited by examiner

Primary Examiner—Joseph Chang
(74) Attorney, Agent, or Firm—RatnerPrestia

(57) ABSTRACT

The present invention provides an oscillator or PLL circuit which can balance the characteristics of a circuit without being affected by noise from a signal line or a supply line. There is provides an oscillator comprising a resonance circuit has a first series connected circuit having coils and a power terminal, a second series connected circuit having capacitors and a varactor having directional characteristics, and a third series connected circuit having capacitors and a varactor having directional characteristics. The first, second, and third series connected circuits are connected in parallel. The varactors are connected so as to have opposite directionalities with respect to a connection side of the second and third series connected circuit. The capacities of the varactors are varied by external control. The varied capacities determine an oscillation frequency.

12 Claims, 18 Drawing Sheets

OSCILLATION WITH MULTIPLE SERIES CIRCUITS IN PARALLEL

BACKGROUND OF THE INVENTION

1. Field of the Invention

The present invention relates to an oscillator, a PLL circuit, communication equipment, and an oscillating method.

2. Related Art of the Invention

Voltage-controlled oscillators are widely used as means of generating local oscillation signals for wireless communication equipment (for example, see Japanese Patent Laid-Open No. 2000-224027). FIG. 9 shows an example of a configuration of a conventional voltage-controlled oscillator. In this figure, the voltage-controlled oscillator is composed of coils 101 and 102, capacitors 103 and 106, a variable capacitor (varactor) 105, oscillation transistors 107 and 108, a current source 116, a power terminal 110, and a voltage control terminal 111. In this figure, a bias circuit and the like are omitted.

With reference to FIG. 9, description will be given below of operations of a conventional voltage-controlled oscillator. A parallel resonance circuit is composed of the coils 101 and 102, the capacitor 103, and the varactor 105. In this case, the capacitance of the varactor 105 is determined by a differential voltage between a control voltage applied to the voltage control terminal 111 and a supply voltage. This in turn determines a resonance frequency for the resonance circuit. The oscillation transistors 107 and 108 generate a negative resistance to cancel losses caused by a parasitic resistance component of the resonance circuit. Thus, in the voltage-controlled oscillator shown in FIG. 9, the control voltage (control signal) can be used to vary an oscillation frequency.

However, such a voltage-controlled oscillator creates the following problems: (1) If noise is superimposed on a voltage control line (i.e. a line leading to the voltage control terminal), the voltage across the varactor 105 may change to change the oscillation frequency. (2) If noise is superimposed on a supply line (a line leading to the power terminal 110), the voltage across the varactor 105 may also change to change the oscillation frequency. Further, the varactor 105 has different parasitic capacitance to ground at each nodes owing to its structure. (3) Such a difference in parasitic capacitance to ground may adversely affect the resonance circuit.

In order to solve the problems (1) and (2), a capacitor 104 has been inserted between the varactor 105 and the coil 101 to hinder a power voltage as shown in FIG. 10. A control signal is thus inputted to the opposite ends of the varactor 105 via voltage control terminals 112 and 113. With this arrangement, even if noise is superimposed on the control signal, a differential voltage between the signals from the voltage control terminals 112 and 113 is applied across the varactor 105. Consequently, the noise component is canceled. Further, the power voltage is not applied across the varactor 105. Even if noise passing through the capacitors 104 and 103 is superimposed on the supply line, voltages having the same magnitude of the noise component are applied to the respective ends of the varactor 105. This serves to avoid the adverse effects of noise on the supply line.

Further, in order to solve the above problem (3), a voltage-controlled oscillator may be used in which as shown in FIG. 11, a varactor 119 arranged oppositely with respect to the varactor 105 and having the same characteristics as those of the varactor 105 is installed in place of the capacitor 103 shown in FIG. 9. In the voltage-controlled oscillator configured as described above, the varactors 105 and 119 cooperate in balancing the parasitic capacitance to ground in the circuit as a whole. This avoids affecting adversely the resonance circuit.

However, the circuit shown in FIG. 11 cannot solve the above problems (1) and (2). Accordingly, in view of this, the circuit shown in FIG. 12 may be used. In addition to the series circuit composed of the varactors 105 and 119 as shown in FIG. 11, the circuit shown in FIG. 12 has a series circuit composed of varactors 114 and 115 connected in series oppositely with respect to those of the varactors 105 and 119, respectively, this second series circuit being connected in parallel with the first series circuit. Further, a voltage control terminal 113 is connected between the varactors 105 and 119, while a voltage control terminal 112 is connected between the varactors 114 and 115. This circuit can solve the above problems (1) and (2) while balancing the parasitic capacitance to ground in the circuit as a whole.

However, the circuit shown in FIG. 10 can solve the problems (1) and (2) but not the problem (3).

Further, with the circuit shown in FIG. 12, no problems occur if each varactor has a linear voltage-capacitance characteristic. However, if this characteristic is nonlinear, the circuit in FIG. 12 cannot solve the problem (1) or (2). This will be described with reference to FIG. 13.

FIG. 13 shows a part composed of the varactors 105, 119, 114, and 115 from FIG. 12. First, an initial state is assumed in which a voltage of 2 V is applied to the voltage control terminal 112, a voltage of 4 V is applied to the voltage control terminal 113, and a voltage of 3 V is applied to the supply line. In this case, a voltage of 1 V, i.e. a difference between the voltage of each voltage control terminal and the supply voltage, is applied across each varactor. When a capacitance determined by each varactor is defined as C, the capacitance of the whole circuit, shown in FIG. 13, is expressed as follows:

$$(C \times C)/(C+C) + (C \times C)/(C+C) = C \qquad \text{[Equation 1]}$$

Now, it is assumed that noise is superimposed on the voltage control line. Since each voltage control line is expected to be equally affected by noise, a noise component of the same phase is superimposed on each voltage control line. That is, it is assumed that a noise component of 0.1 V affects the voltage applied to the voltage control terminal 112, i.e. 2 V, which thus becomes 2.1 V. It is similarly assumed that a noise component of 0.1 V affects the voltage applied to the voltage control terminal 113, i.e. 4 V, which thus becomes 4.1 V.

In this case, the voltage applied to the varactors 114 and 115 is 3−2.1=0.9 V. The voltage applied to the varactors 105 and 119 is 4.1−3=1.1 V. Here, if each varactor is assumed to have linear characteristics, the varactors 114 and 115 have a capacitance of 0.9 C, whereas the varactors 105 and 119 have a capacitance of 1.1 C. As described above, the capacitance of the whole circuit, shown in FIG. 13, is calculated as follows:

$$(0.9C \times 0.9C)/(0.9C+0.9C) + (1.1C \times 1.1C)/(1.1C+1.1C) = C \qquad \text{[Equation 2]}$$

However, each varactor generally has a nonlinear voltage-capacitance characteristic, for example, as shown in FIG. 14. With such non-linearity assumed, for example, the varactors 114 and 115 have a capacitance of 3 C, whereas the varactors 105 and 119 have a capacitance of 0.5 C. In this case, the capacitance of the whole circuit, shown in FIG. 13, is calculated as follows:

$$(0.5C \times 0.5C)/(0.5C+0.5C)+(3C \times 3C)/(3C+3C)=1.75C \quad \text{[Equation 3]}$$

This deviates from the result obtained under the assumption that each varactor has linear characteristics. As described above, with the non-linearity of each varactor assumed, the circuit shown in FIG. 12 cannot solve the above problem (1).

Further, FIG. 21 shows a variation (see U.S. Pat. No. 6,292,065) of the circuit shown in FIG. 12. In the circuit shown in FIG. 21, a bias voltage is applied to terminals 162, 164, 166, and 168. A signal voltage is inputted to terminals 1118 and 1120. If varactors 122, 124, 126, and 128 have nonlinear characteristics, this circuit also cannot solve the problem (1) for a reason similar to that described above.

SUMMARY OF THE INVENTION

In view of the above problems, it is an object of the present invention to provide an oscillator that can balance the characteristics of a circuit without being affected by noise from a signal line or a supply line, a PLL circuit that utilizes this oscillator, or communication equipment that utilizes this oscillator or PLL circuit.

It is an object of the present invention to provide an oscillator that can balance the characteristics of a circuit without being affected by noise from a signal line, a PLL circuit that utilizes this oscillator, or communication equipment that utilizes this oscillator or PLL circuit.

The first aspect of the present invention is an oscillator comprising a resonance circuit comprising:

a first series connected circuit having an inductive impedance element;

a second series connected circuit having a first capacitive impedance element, a first variable capacitive impedance element connected in series with said first capacitive impedance element and having a directional characteristic, and a second capacitive impedance element connected in series with said first variable capacitive impedance element; and a third series connected circuit having a third capacitive impedance element, a second variable capacitive impedance element connected in series with said third capacitive impedance element and having a directional characteristic, and a fourth capacitive impedance element connected in series with said second variable capacitive impedance element, and wherein said first series connected circuit, said second series connected circuit, and said third series connected circuit are connected in parallel, and said first variable capacitive impedance element and said second variable capacitive impedance element are oppositely connected with respect to either connection side of said second series connected circuit and said third series connected circuit, and wherein variable capacities of said first variable capacitive impedance element and said second variable capacitive impedance element are externally controlled to be varied.

The second aspect of the present invention is the oscillator according to the first aspect of the present invention, wherein the directional characteristic of said first variable capacitive impedance element and said second variable capacitive impedance element is a parasitic capacitance to ground, and one of the terminals of each of said first and second variable capacitive impedance elements which has a larger parasitic capacitance to ground is defined as a first terminal, while the other, which has a smaller parasitic capacitance to ground, is defined as a second terminal, and a first control voltage is applied to the first terminal of each of said first and second variable capacitive impedance elements, while a second control voltage is applied to the second terminal of each of said first and second variable capacitive impedance elements, said first control voltage and said second control voltage being adjusted to determine an oscillation frequency.

The third aspect of the present invention is an oscillator comprising a resonance circuit comprising:

a first series connected circuit having an inductive impedance element;

a second series connected circuit having a first capacitive impedance element, a first variable capacitive impedance element connected in series with said first capacitive impedance element and having a predetermined directional characteristic, a second variable capacitive impedance element connected in series with and opposite said first variable capacitive impedance element, and a second capacitive impedance element connected in series with said second variable capacitive impedance element; and a third series connected circuit having a third capacitive impedance element, a third variable capacitive impedance element connected in series with said third capacitive impedance element and having a predetermined directional characteristic, a fourth variable capacitive impedance element connected in series with and opposite said third variable capacitive impedance element, and a fourth capacitive impedance element connected in series with said fourth variable capacitive impedance element, and wherein said first series connected circuit, said second series connected circuit, and said third series connected circuit are connected in parallel, and said second variable capacitive impedance element and said fourth variable capacitive impedance element are oppositely connected with respect to either connection side of said second series connected circuit and said third series connected circuit, and wherein one of the terminals of each of said first, second, third, and fourth variable capacitive impedance elements which has a larger value of said predetermined characteristic, is defined as a first terminal while the other, which has a smaller value of said predetermined characteristic, is defined as a second terminal, a first control voltage is applied to the first terminal of each of said first, second, third, and fourth variable capacitive impedance elements, while a second control voltage is applied to the second terminal of each of said first, second, third, and fourth variable capacitive impedance elements, said first control voltage and said second control voltage being adjusted to determine an oscillation frequency.

The fourth aspect of the present invention is the oscillator according to the third aspect of the present invention, wherein the value of said predetermined characteristic is a parasitic capacitance to ground.

The fifth aspect of the present invention is the oscillator according to the first aspect of the present invention, wherein said variable capacitive impedance element utilizes a gate capacity of a MOS transistor formed by a CMOS process.

The sixth aspect of the present invention is a PLL circuit comprising:

an oscillator according to the second aspect of the present invention;

a charge pump to which a reference signal and an oscillation signal outputted by said oscillator are inputted and by which two output voltages are outputted in accordance with a difference in phase between said reference signal and said oscillation signal; and a loop filter which low pass filters the two output voltages outputted by said charge pump, and wherein, two outputs of said loop filter are connected to said oscillator so as to apply said first control voltage and said second control voltage to said oscillator.

The seventh aspect of the present invention is a PLL circuit comprising:

an oscillator according to the second aspect of the present invention;

phase comparison means to which a reference signal and an oscillation signal outputted by said oscillator are inputted and by which two output voltages are outputted as an exclusive OR (XOR) of said reference signal and said oscillation signal and as a signal (XNOR) obtained by reversing said exclusive OR; and a loop filter which low pass filters the two output voltages, and two outputs of said loop filter are connected to said oscillator so as to apply said first control voltage and said second control voltage to said oscillator.

The eighth aspect of the present invention is the PLL circuit according to the sixth or the seventh aspects of the present invention, wherein one of the ends of each of a first and second switches is connected to a corresponding one of the two outputs of said loop filter, and the other end of each of said first and second switches is connected to a DC power source having a predetermined voltage.

The ninth aspect of the present invention is the PLL circuit according to the sixth or the seventh aspects of the present invention, wherein a reference voltage difference corresponding to a desired oscillation frequency is inputted to said oscillator using a desired timing.

The tenth aspect of the present invention is the PLL circuit according to the sixth aspect of the present invention, wherein central voltage detecting means is connected to the two outputs of said loop filter to detect a central voltage between said first control voltage and said second control voltage, and a central voltage detection signal outputted by said central voltage detecting means is fed back to said charge pump.

The eleventh aspect of the present invention is the PLL circuit according to the sixth or the seventh aspects of the present invention, wherein said loop filter has a first input terminal and a second input terminal to which the respective output voltages outputted by the charge pump are inputted, and a first output terminal and a second output terminal used to output said first control voltage and said second control voltage, respectively, to said oscillator, and is configured so that an impedance from said first input terminal to said first output terminal is equal to an impedance from said second input terminal to said second output terminal, an impedance from said first input terminal to said second output terminal is equal to an impedance from said second input terminal to said first output terminal, and a floating capacity of the whole loop filter is balanced.

The twelfth aspect of the present invention is communication equipment comprising a transmission circuit, a reception circuit, and an antenna, wherein said transmission and/or reception circuit has an oscillator according to claim 1 or a PLL circuit according to the sixth or the seventh aspects of the present invention.

The thirteenth aspect of the present invention is an oscillating method using an oscillation circuit comprising a resonance circuit comprising:

a first series connected circuit having an inductive impedance element;

a second series connected circuit having a first capacitive impedance element, a first variable capacitive impedance element connected in series with said first capacitive impedance element and having a directional characteristic, and a second capacitive impedance element connected in series with said first variable capacitive impedance element; and a third series connected circuit having a third capacitive impedance element, a second variable capacitive impedance element connected in series with said third capacitive impedance element and having a directional characteristic, and a fourth capacitive impedance element connected in series with said second variable capacitive impedance element, and wherein said first series connected circuit, said second series connected circuit, and said third series connected circuit are connected in parallel, and said first variable capacitive impedance element and said second variable capacitive impedance element are oppositely connected with respect to either connection side of said second series connected circuit and said third series connected circuit, and wherein variable capacities of said first variable capacitive impedance element and said second variable capacitive impedance element are externally controlled to be varied.

Figure 1:
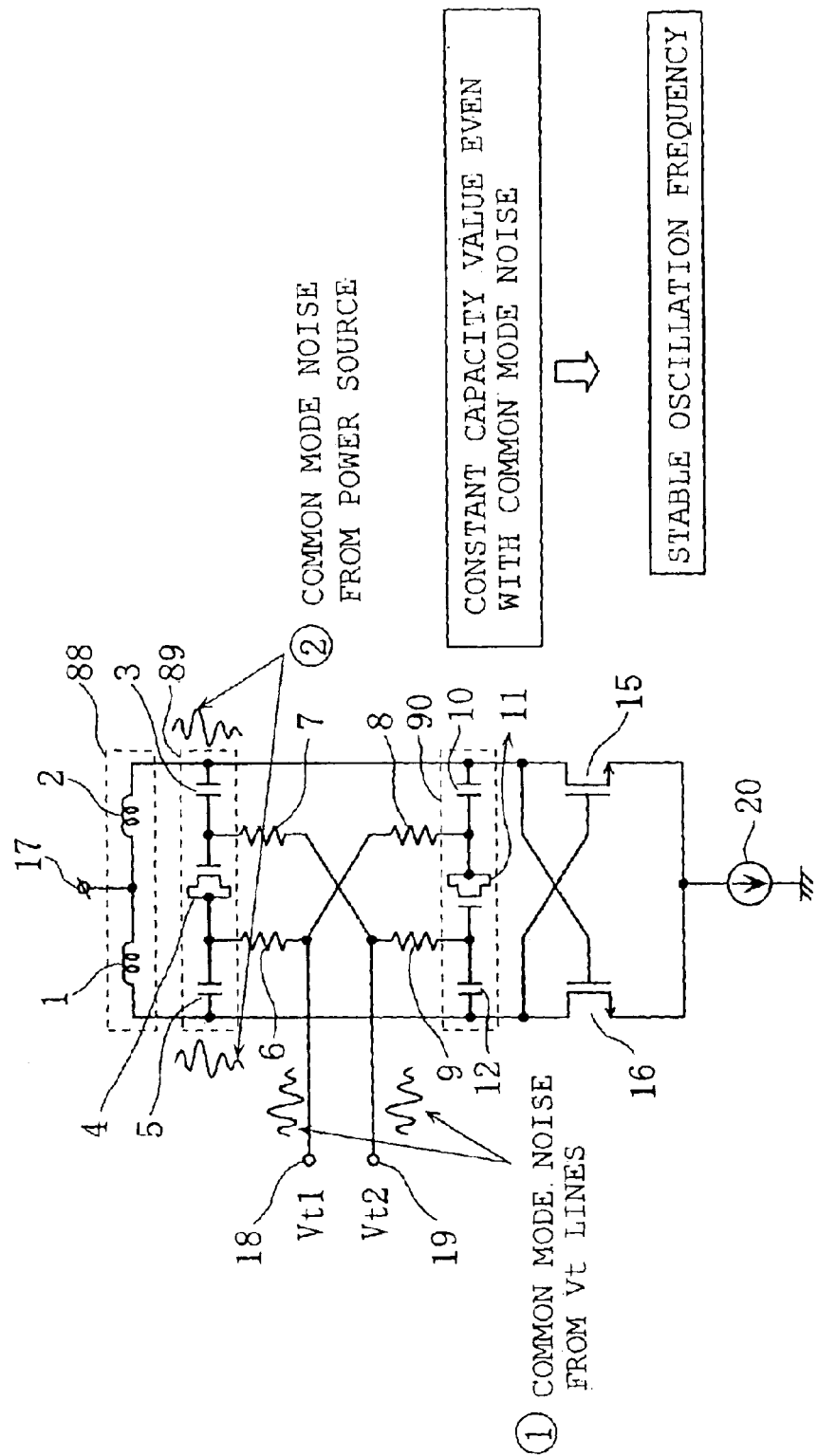
FIG. 1 is a circuit diagram showing a configuration of a voltage-controlled oscillator according to Embodiment 1 of the present invention.

DESCRIPTION OF SYMBOLS 4, 11 Varactors
15, 16 Transistors
18, 19 Voltage control terminals
17 Power terminal
50 Voltage-controlled oscillator
51 Phase frequency comparator
52, 53, 54, 55 Constant current circuits
58, 59, 60, 61 Switches
56 Loop filter
83, 84 Switches
85 Reference bias power source
86 Central voltage detecting means

PREFERRED EMBODIMENTS OF THE INVENTION (Embodiment 1)

FIG. 1 shows a circuit of an oscillator according to Embodiment 1 of the present invention. The circuit shown in FIG. 1 has a first series connected circuit 88 as an example of a first series connected circuit according to the present invention which circuit comprises a coil 1 as an example of an inductive impedance element according to the present invention, a coil 2 as another example of an inductive impedance element according to the present invention which coil is connected in series with the coil 1, and a power terminal 17 as an example of a power terminal according to the present invention which terminal is connected between the coils 1 and 2 for a power supply; a second series connected circuit 89 as an example of a second series connected circuit according to the present invention which circuit comprises a capacitor 5 as an example of a first capacitive impedance element according to the present invention, a varactor 4 as an example of a first variable capacitive impedance element according to the present invention which varactor is composed of a terminal (hereinafter referred to as a "first terminal") connected to the capacitor 5 and to an electrode produced by short-circuiting a drain and a source of a MOSFET, and a capacitor 3 as an example of a second capacitive impedance element according to the present invention which capacitor is connected to a terminal (hereinafter referred to as a "second terminal") connected to a gate electrode of the varactor 4; and a third series connected circuit 90 an example of a third series connected circuit according to the present invention which circuit comprises a capacitor 12 as an example of a third capacitive impedance element according to the present invention, a varactor 11 as an example of a second variable capacitive impedance element according to the present invention which varactor has a second terminal connected to the capacitor 12, and a capacitor 10 as an example of a fourth capacitive impedance element which capacitor is connected to a first terminal of the varactor 11. The first series connected circuit 88, the second series connected circuit 89, and the third series connected circuit 90 are connected in parallel in a way that the coil 1 and the capacitors 5 and 12 are connected to the respective series connected circuits, while the coil 2 and the capacitors 3 and 10 are connected to the respective series connected circuits to form a resonance circuit.

The first terminal of each of the varactors 4 and 11 is produced by short-circuiting the drain and source of the MOSFET (MOS transistor) formed by a CMOS process as described above. Its second terminal comprises a gate of the MOSFET. Thus, the capacitance of each of the varactors 4 and 11 comprises a gate capacity. Accordingly, since the MOSFET is designed so that the first terminal is connected to a substrate, the first terminal has a larger parasitic capacitance to ground than the second terminal. Specifically, the varactors 4 and 11 each have a directional parasitic capacitance to ground.

In the resonance circuit formed as described above, the second series connected circuit 89 and the third series connected circuit 90 are connected together so that the varactors 4 and 11 have opposite directionalities with respect to either connection side of the second series connected circuit 89 and third series connected circuit 90.

In the above resonance circuit, a voltage control terminal 18 is connected to the first terminal of the varactor 4 via a resistor 6 and to the first terminal of the varactor 11 via a resistor 8, in order to supply a first control voltage. Further, a voltage control terminal 19 is connected to the second terminal of the varactor 4 via a resistor 7 and to the second terminal of the varactor 11 via a resistor 9, in order to supply a second control voltage.

In the resonance circuit configured as described above, a gate of a transistor 15 and a drain of a transistor 16 are connected to a connection point of each of the coil 1 and the capacitors 5 and 12. A gate of the transistor 16 and a drain of the transistor 15 are connected to a connection point of each of the coil 2 and the capacitors 3 and 10. On the other hand, a source of the transistor 16 and a source of the transistor 15 are connected together and to one of the terminals of a current source 20. The other terminal of the current source 20 is grounded.

Now, a description will be given of operations of the oscillator configured as described above.

A supply voltage is supplied by the power terminal 17 to the transistors 16 and 15 via the coils 1 and 2, respectively. Outputs from the transistors 16 and 15 are looped back to the gates of the transistors 15 and 16, respectively. Thus, an oscillation signal is generated which has a frequency determined by the resonance circuit.

On the other hand, a first control voltage $V_{r1}$ inputted through a voltage control terminal 18 is applied to the first terminal of the varactor 4 via the resistor 6 and to the first terminal of the varactor 11 via the resistor 8. A second control voltage $V_{r2}$ inputted through a voltage control terminal 19 is applied to the second terminal of the varactor 4 via the resistor 7 and to the second terminal of the varactor 11 via the resistor 9. Consequently, the differential voltage between $V_{t1}$ and $V_{t2}$ is applied to the varactors 4 and 11. In this case, the varactor 4 is blocked by the capacitors 5 and 3 and is thus not supplied with the supply voltage. Likewise, the varactor 11 is hindered by the capacitors 12 and 10 from being supplied with the supply voltage. In this manner, the varactors 4 and 11 have their capacities determined only by the differential voltage between $V_{t1}$ and $Vt_2$.

A resonance frequency is determined by the parallel resonance circuit composed of the second series connected circuit 89 containing the thus determined capacitance of the varactor 4, the third series connected circuit 90 containing the similarly determined capacitance of the varactor 11, and the first series connected circuit 88.

In this case, it is assumed that $V_{t1}$ and $V_{t2}$ are affected by noise. If a PLL circuit having the above oscillator constitutes a wireless part of a mobile communication terminal or the like and a circuit operating on the basis of a large current and this PLL circuit are mounted on the same substrate, then noise is generated by a variation in voltage with respect to ground or supply voltage occurring at the rising edge of a power amplifier or by the interference of electromagnetic fields caused by electromagnetic waves emitted by an antenna. Such noise may affect $V_{t1}$ and $V_{t2}$ with the same phase. Since the differential voltage between $V_{t1}$ and $V_{t2}$ is applied across the varactors 4 and 11, this noise is canceled and does not produce any adverse effects.

On the other hand, even if the supply voltage is affected by the noise and a noise component passes through the capacitors 5 and 3, the same voltage affected by the noise is applied to both ends of the varactor 4. Consequently, these noise components are canceled to prevent the varactor 4 from being affected by the noise from the supply voltage. Likewise, the varactor 11 is not affected by the noise from the supply voltage.

Further, the second series connected circuit 89 and the third series connected circuit 90 are connected together so that the varactors 4 and 11 have opposite directionalities. Thus, in the resonance circuit as a whole, the balance of the parasitic capacitance to ground is maintained. This prevents the oscillation frequency and balance operations of the circuit from being adversely affected.

As described above, the oscillator of the present embodiment can eliminate the adverse effects of noise from the voltage control line and supply line. This in turn eliminates the adverse effects of the imbalance of the parasitic capacitance to ground on the resonance circuit.

(Embodiment 2)

Figure 2:
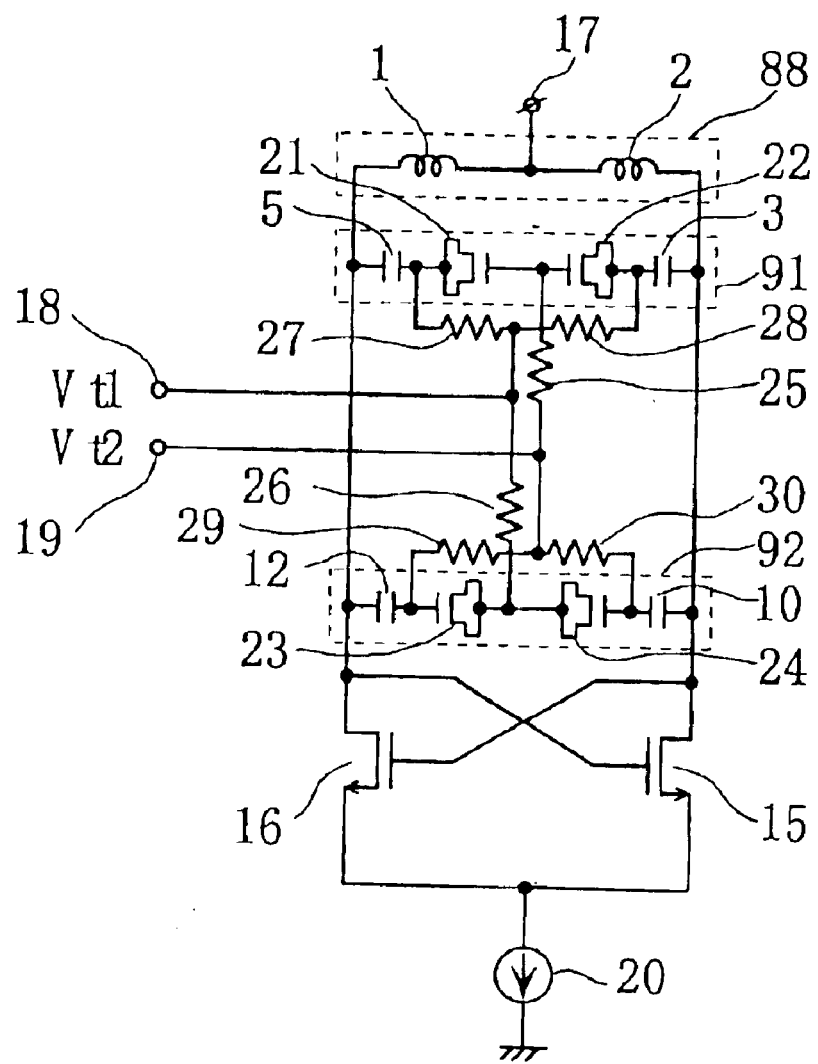
FIG. 2 is a circuit diagram showing a configuration of a voltage-controlled oscillator according to Embodiment 2 of the present invention.

FIG. 2 shows a circuit representing a configuration of an oscillator according to Embodiment 2 of the present invention.

In the configuration of the circuit according to the present embodiment, the same components as those of the oscillator according to Embodiment 1 are denoted by the same reference numerals. Their description is omitted. The present embodiment differs from Embodiment 1 in the points described below. A second series connected circuit 91 is composed of the capacitor 5, a varactor 21 as an example of the first variable capacitive impedance element according to the present invention which varactor has a first terminal connected to the capacitor 5, a varactor 22 as an example of the second variable capacitive impedance element according to the present invention which varactor has a second terminal connected to a second terminal of the varactor 21, and the capacitor 3 connected to a first terminal of the varactor 22. A third series connected circuit 92 is composed of the capacitor 12, a varactor 23 as an example of the third variable capacitive impedance element according to the present invention which varactor has a second terminal connected to the capacitor 12, a varactor 24 as an example of the fourth variable capacitive impedance element according to the present invention which varactor has a first terminal connected to a first terminal of the varactor 23, and the capacitor 10 connected to a second terminal of the varactor 24.

Further, the voltage control terminal 18 is connected to the first terminal of the varactor 21 of the second series connected circuit via a resistor 27, to the first terminal of the varactor 22 via a resistor 28, and to the first terminals of the varactors 23 and 24 of the third series connected circuit via a resistor 26. The voltage control terminal 19 is connected to the second terminal of the varactor 23 of the third series connected circuit via a resistor 29, to the second terminal of the varactor 24 via a resistor 30, and to the second terminals of the varactors 21 and 22 of the second series connected circuit via a resistor 25.

With the oscillator configured as described above, the differential voltage between $V_{t1}$ and $V_{t2}$ is always applied to each varactor. Accordingly, even if each varactor has a nonlinear voltage-capacitance characteristic, noise superimposed on $V_{t1}$ and $V_{t2}$ is canceled and becomes ineffective.

Further, in the second series connected circuit 91, the varactors 21 and 22 are connected to have opposite directionalities. In the third series connected circuit 92, the varactors 23 and 24 are connected to have opposite directionalities. The varactors 22 and 24 are connected to have opposite directionalities with respective to a connection side of the capacitors 3 and 10, i.e. one of the connection sides of the second series connected circuit 91 and the third series connected circuit 92. Consequently, in the whole resonance circuit, the balance of the parasitic capacitance to ground is maintained. This prevents the resonance frequency and balance operations of the circuit from being adversely affected.

Thus, even if each varactor has a nonlinear voltage-capacitance characteristic, the oscillator of the present embodiment can eliminate the adverse effects of noise from the voltage control line. It is also possible to eliminate the adverse effects of the imbalance of the parasitic capacitance to ground on the resonance circuit.

Figure 15:
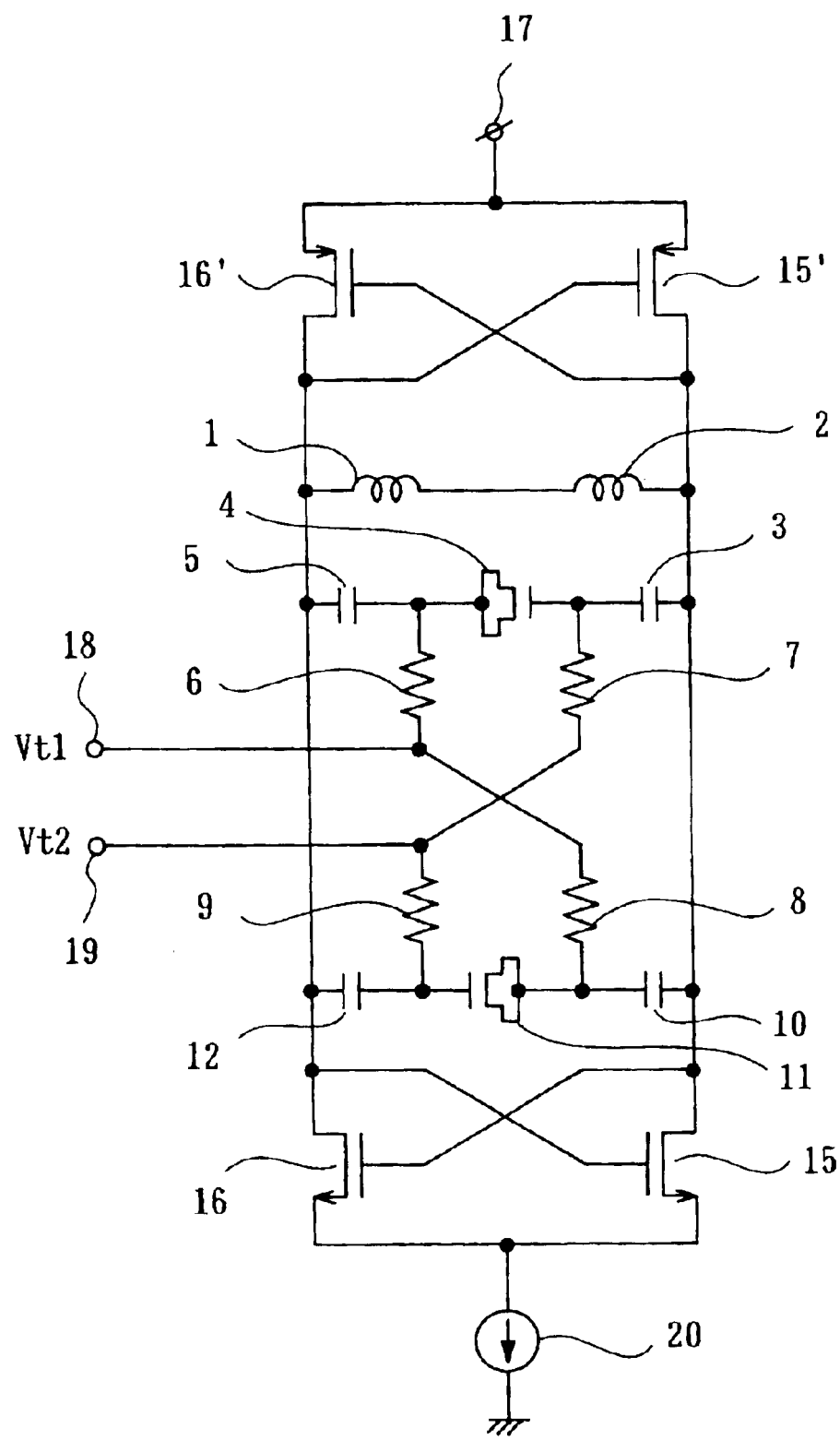
FIG. 15 is a circuit diagram showing a variation of the voltage-controlled oscillator according to one of the embodiments of the present invention.

In the above description, the power terminal 17 is installed between the coils 1 and 2. However, the power terminal 17 may be located at the connection point between transistors 15' and 16' as shown in FIG. 15. In this case, the first series connected circuit according to the present invention is composed of the coils 1 and 2. Alternatively, the first series connected circuit according to the preset invention may be configured to have a single coil.

Figure 16:
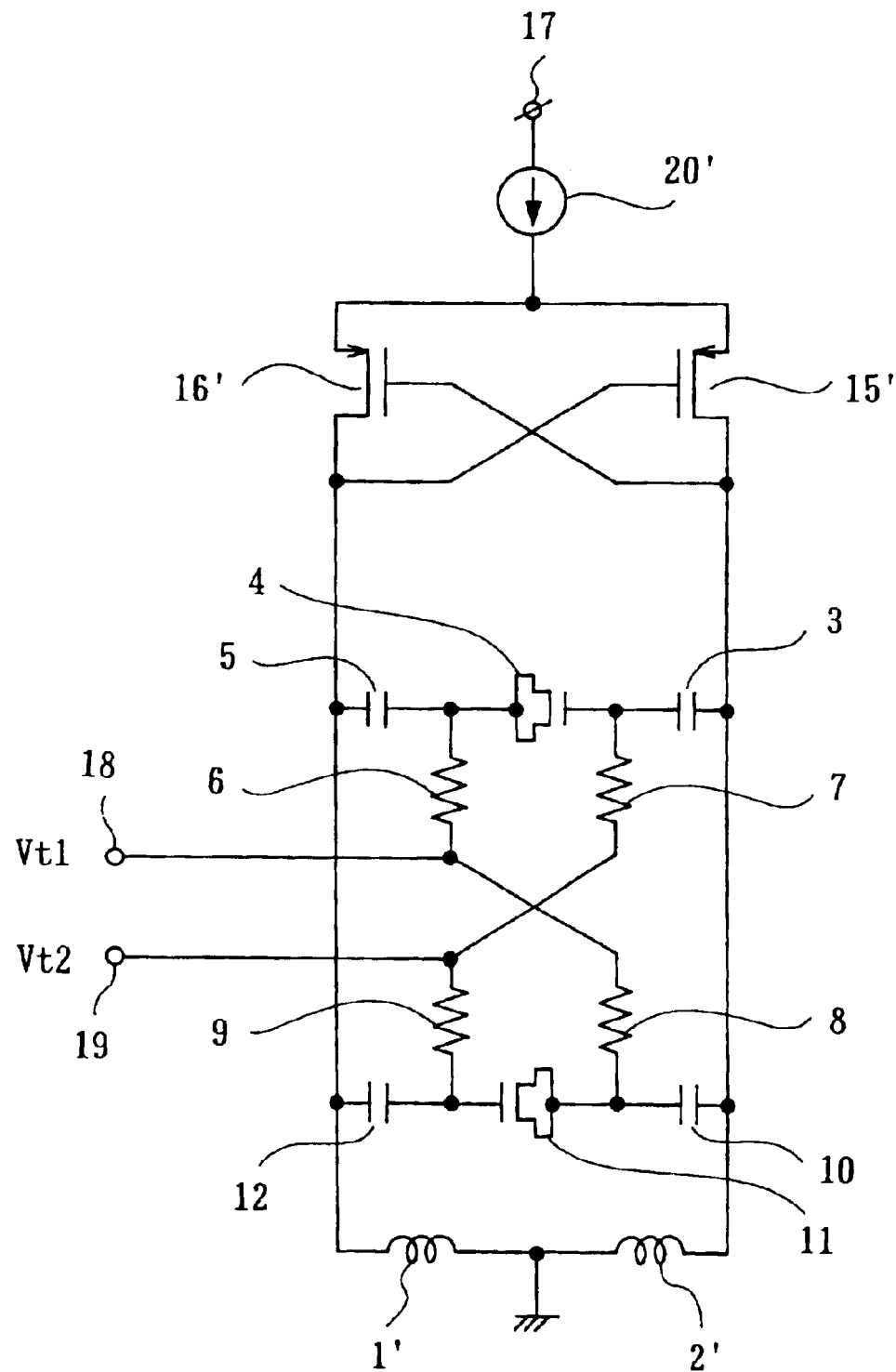
FIG. 16 is a circuit diagram showing a variation of the voltage-controlled oscillator according to one of the embodiments of the present invention.

Alternatively, as shown in FIG. 16, one side of a current source 20' may be connected to the connection point between the transistors 15' and 16'. Further, the connection point between coils 1' and 2' may be grounded. In this case, the power terminal 17 is connected to the other side of the current source 20'. This configuration can produce effects similar to those described above.

(Embodiment 3)

Figure 3:
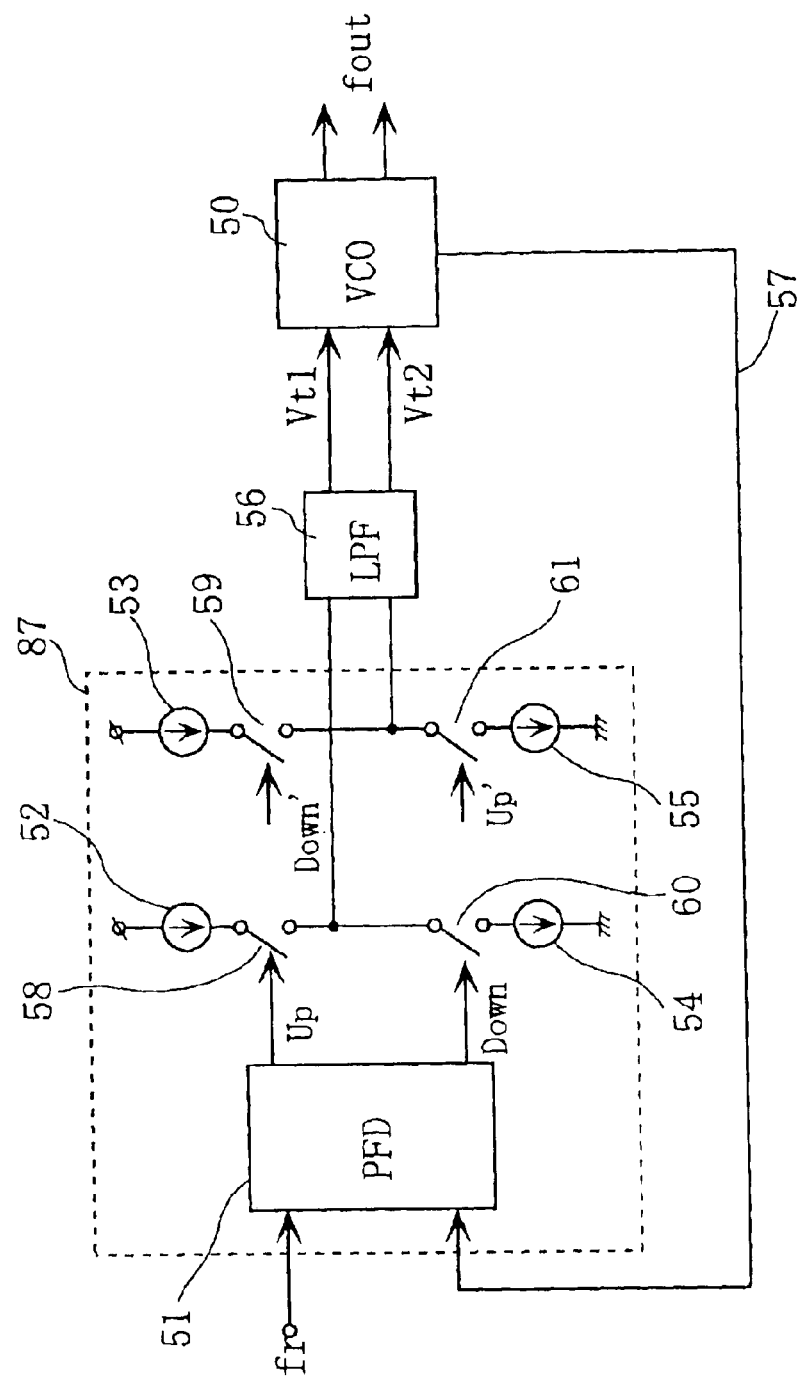
FIG. 3 is a circuit diagram showing a configuration of a PLL circuit according to Embodiment 3 of the present invention.

As Embodiment 3 of the present invention, FIG. 3 shows a PLL circuit that utilizes a voltage-controlled oscillator (VCO) 50 according to Embodiments 1 and 2. The PLL circuit according to Embodiment 3 has a phase frequency comparator (PFD) 51 that compares the phase of a reference signal fr with the phase of an oscillation signal obtained from the voltage-controlled oscillator 50 to output an up signal and a down signal. An up signal output of the phase frequency comparator 51 is in communication with switches 58 and 61 so as to simultaneously open and close them in a controllable manner. A down signal output of the phase frequency comparator 51 is in communication with switches 60 and 59 so as to simultaneously open and close them in a controllable manner.

Specifically, when the phase frequency comparator 51 outputs an up signal, the switches 58 and 61 are turned on, while the switches 59 and 60 are turned off. On the other hand, when the phase frequency comparator 51 outputs a down signal, the switches 58 and 61 are turned off, while the switches 59 and 60 are turned on. These operations can be accomplished by, for example, constructing the switches 58 and 61 using n-MOS transistors, while constructing the switches 59 and 60 using p-MOS transistors.

One end of the switch 58 is connected to a charging supply voltage via a constant current circuit 52. The other end of the switch 58 is connected to one end of the switch 60. The other end of the switch 60 is grounded via a constant current circuit 54. On the other hand, one end of the switch 59 is connected to the charging supply voltage via a constant current circuit 53. The other end of the switch 59 is connected to one end of the switch 61. The other end of the switch 61 is grounded via a constant current circuit 55. A charge pump 87 is constituted by the phase frequency comparator 51, the switches 58, 59, 60, and 61, and the constant current circuits 52, 53, 54, and 55.

An input of a loop filter 56 connects to a line (hereinafter referred to as a "first connection line") connecting the other end of the switch 58 and one end of the switch 60 together and to a line (hereinafter referred to as a "second connection line") connecting the other end of the switch 59 and one end of the switch 61 together. An output of the loop filter 56 is connected to the voltage control terminals 18 and 19 of the voltage-controlled oscillator 50 as a voltage control line. Further, in order to return a part of the oscillation signal generated by the voltage-controlled oscillator 50, to the input of the phase frequency comparator 51, the voltage-controlled oscillator 50 is connected to the input of the phase frequency comparator 51 via a feedback line 57.

Description will be given of operations of the PLL circuit configured as described above. An oscillation signal obtained from the voltage-controlled oscillator 50 is inputted to the input of the phase frequency comparator 51 via the feedback line 57. The phase frequency comparator 51 compares the phase of the reference signal fr with the phase of the inputted oscillation signal to output an up signal or a down signal from its output on the basis of the result of the comparison.

Specifically, if the phase of the oscillation signal is delayed compared to the phase of the reference signal fr, an up signal is outputted in accordance with the degree of the delay. Then, the switches 58 and 61 are intermittently and simultaneously turned on at predetermined time intervals according to the up signal.

With these operations, the first connection line is charged by the power source and has its voltage increased. In contrast, the second connection line discharges to the ground and thus has its voltage decreased. In this manner, after having its low pass filtered by the loop filter 56, a control signal is inputted to the voltage-controlled oscillator 50 as a differential voltage in which the voltage of the first connection line and the voltage of the second connection line vary complementarily. The resonation frequency is adjusted in accordance with this differential voltage.

On the other hand, if the phase of the oscillation signal is advanced compared to the phase of the reference signal, a down signal is outputted in accordance with the degree of the advancement. Then, the switches 59 and 60 are intermittently turned on at predetermined time intervals according to the down signal.

In contrast, with the above operations, the first connection line discharges to the ground and thus has its voltage decreased, whereas the second connection line is charged by the power source and has its voltage increased. In this manner, a control voltage is inputted to the voltage-controlled oscillator 50 as a differential voltage in which the voltage of the first connection line and the voltage of the second connection line vary complementarily. The resonation frequency is adjusted in accordance with this differential voltage.

Figure 4:
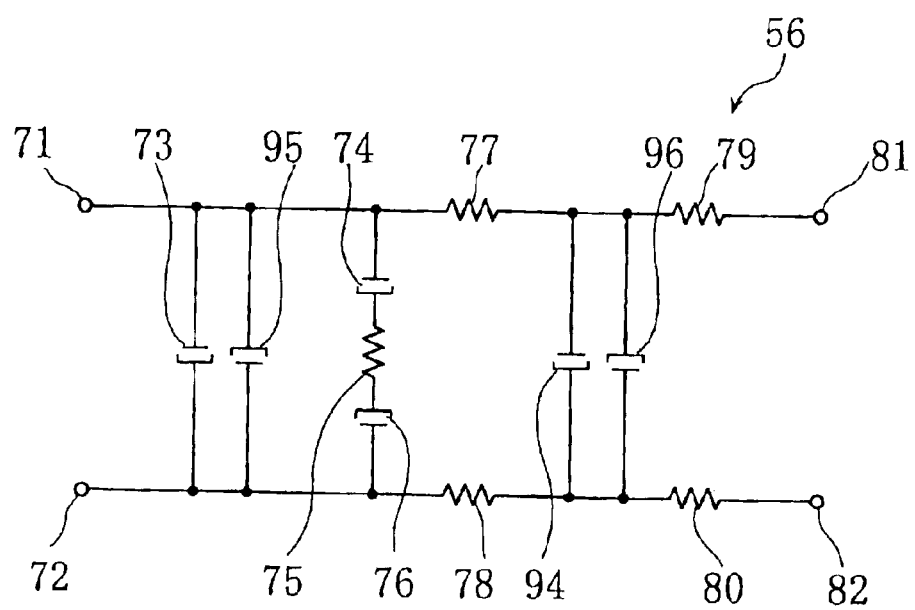
FIG. 4 is a circuit diagram showing an example of a configuration of a loop filter in the PLL circuit according to Embodiment 3 of the present invention.

The loop filter 56 as described above in the present embodiment is configured, for example, as shown in FIG. 4.

The loop filter 56, shown in FIG. 4, has a capacitor 73 connected in parallel with input terminals 71 and 72, a capacitor 95 connected in parallel with the capacitor 73, a series connected circuit composed of a capacitor 74, a resistor 75, and a capacitor 76 connected in parallel with the capacitor 95, resistors 77 and 79 interposed in series between the input terminal 71 and an output terminal 81, resistors 78 and 80 interposed in series between the input terminal 72 and an output terminal 82, a capacitor 94 connectively arranged to join the connection point between the resistors 77 and 79 and the connection point between the resistors 78 and 80, and a capacitor 96 connected in parallel with the capacitor 94.

If the loop filter 56 is formed on an integrated substrate, each capacitor has a directional floating capacity because its two electrodes have different floating capacities with respect to the substrate. Thus, in this case, the capacitors 73 and 95 are connected together so as to have opposite directionalities with respect to either connection side of them. The capacitors 74 and 76 are connected together so as to have opposite directionalities with respect to the resistor 75. The capacitors 94 and 96 are connected together so as to have opposite directionalities with respect to either connection side of them. The capacitors are thus connected together so as to balance the floating capacity of the whole loop filter 56.

Further, the loop filter 56 is configured to balance its own impedance. Specifically, values for each capacitor and each resistor are set so that the impedance between the input terminal 71 and the output terminal 81 equals the impedance between the input terminal 72 and the output terminal 82 and so that the impedance between the input terminal 71 and the output terminal 82 equals the impedance between the input terminal 72 and the output terminal 81. When the loop filter 56 as a whole has an electric symmetry, an output signal from the loop filter 56 is not imbalanced if a differential signal is inputted to it.

In the description of the present embodiment, the loop filter 56 is configured as shown in FIG. 4. However, the present invention is not limited to this example. An arbitrary configuration may be used provided that the impedance between the input terminal 71 and the output terminal 81 equals the impedance between the input terminal 72 and the output terminal 82, while the impedance between the input terminal 71 and the output terminal 82 equals the impedance between the input terminal 72 and the output terminal 81 and that the total floating capacity is balanced, as described above. Such a configuration produces effects similar to those described above.

Further, in the description of the present embodiment, an input signal from the feedback line 57 and the reference signal fr are each a single-phase signal. However, these signals may each be a differential signal.

(Embodiment 4)

Figure 5:
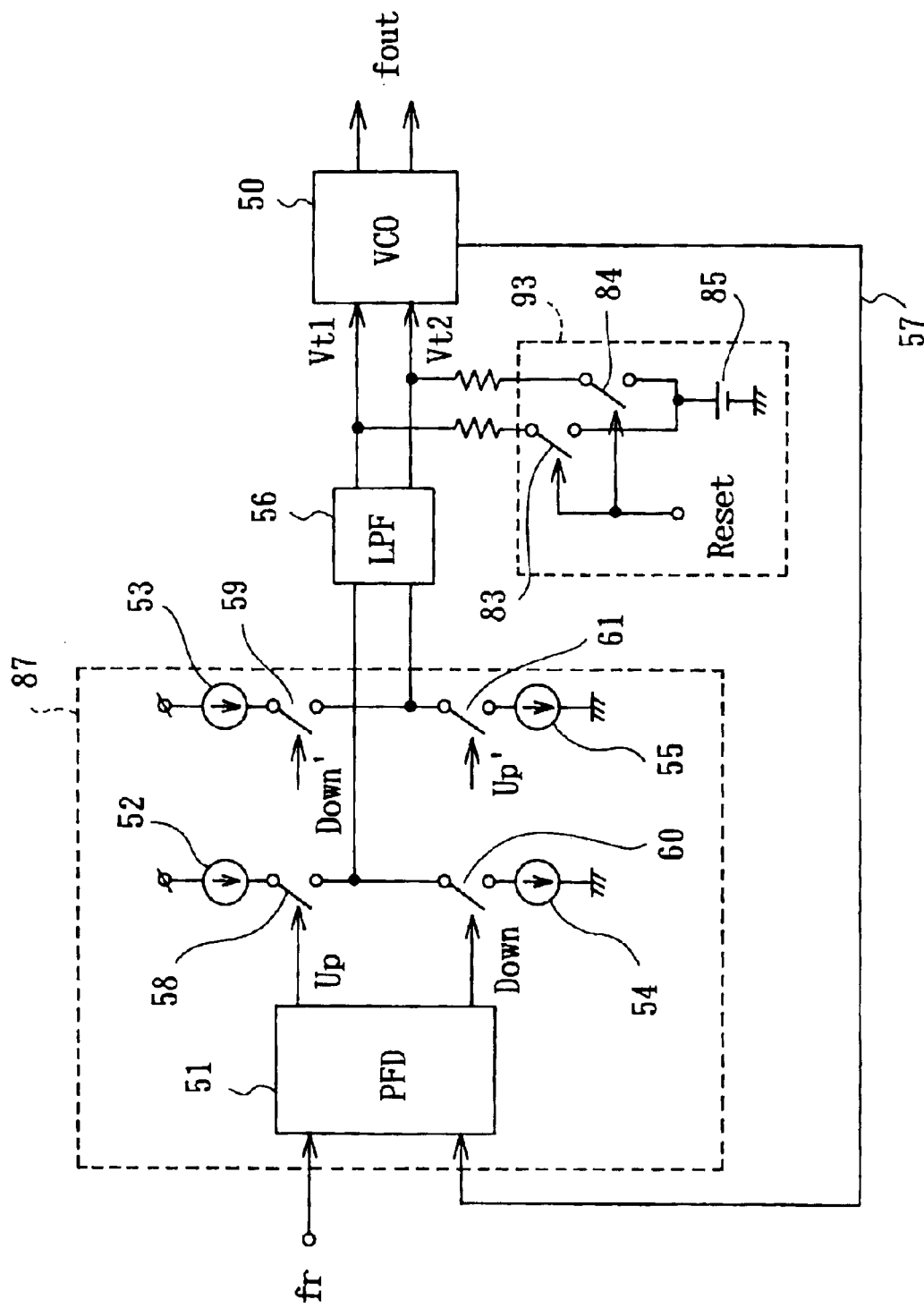
FIG. 5 is a circuit diagram showing a configuration of a PLL circuit according to Embodiment 4 of the present invention.

FIG. 5 shows a configuration of a PLL circuit according to Embodiment 4 of the present invention. The configuration of the PLL circuit of Embodiment 4 differs from the configuration of the PLL circuit shown in FIG. 3 in that a reset circuit 93 is provided between the loop filter 56 and the voltage-controlled oscillator 50. The other components of the PLL circuit of the present embodiment are similar to those of the PLL circuit shown in FIG. 3. The same components are denoted by the same reference numerals and their description is omitted.

Specifically, one end of a switch 83 operating in accordance with a reset signal is connected to a first control voltage line (hereinafter referred to as a "$V_{t1}$ line") from the output of the loop filter 56. Similarly, one end of a switch 84 operating in accordance with a reset signal is connected to a second control voltage line (hereinafter referred to as a "$V_{t2}$ line") from the output of the loop filter 56. The other ends of the switches 83 and 84 are connected to one of the polarities of a reference bias power source 85 as an example of a DC power source according to the present invention which power source supplies a reference bias voltage. The other polarity of the reference bias power source 85 is grounded. In this manner, a reset circuit 93 is composed of a reset switch (not shown) that generates a reset signal, the switches 83 and 84, and the reference bias power source 85.

According to the PLL circuit configured as described above, the voltages $V_{t1}$ and $V_{t2}$ can be reset to the reference bias voltage by providing a reset signal. For example, when the oscillation frequency is to be changed, the voltage-controlled oscillator can be stably operated by resetting the $V_{t1}$ and $V_{t2}$ lines to the reference bias voltage.

Further, since the reset circuit 93 is provided between the loop filter 56 and the voltage-controlled oscillator, the $V_{t1}$ and $V_{t2}$ lines can immediately be reset to the reference bias voltage (without being affected by the transient response of the loop filter) as soon as the reset signal is outputted.

Figure 17:
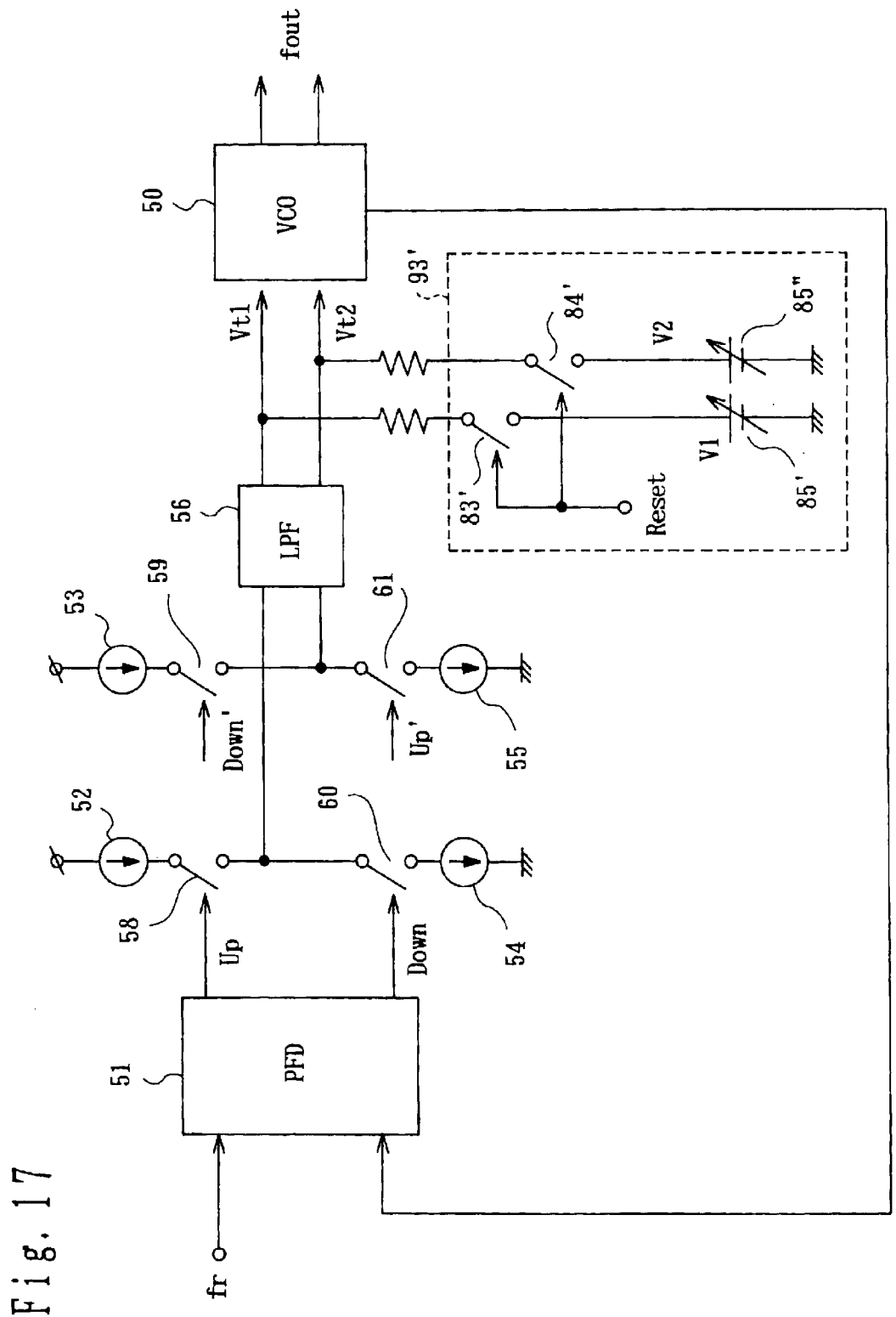
FIG. 17 is a circuit diagram showing a variation of the PLL circuit according to one of the embodiments of the present invention.
Figure 18:
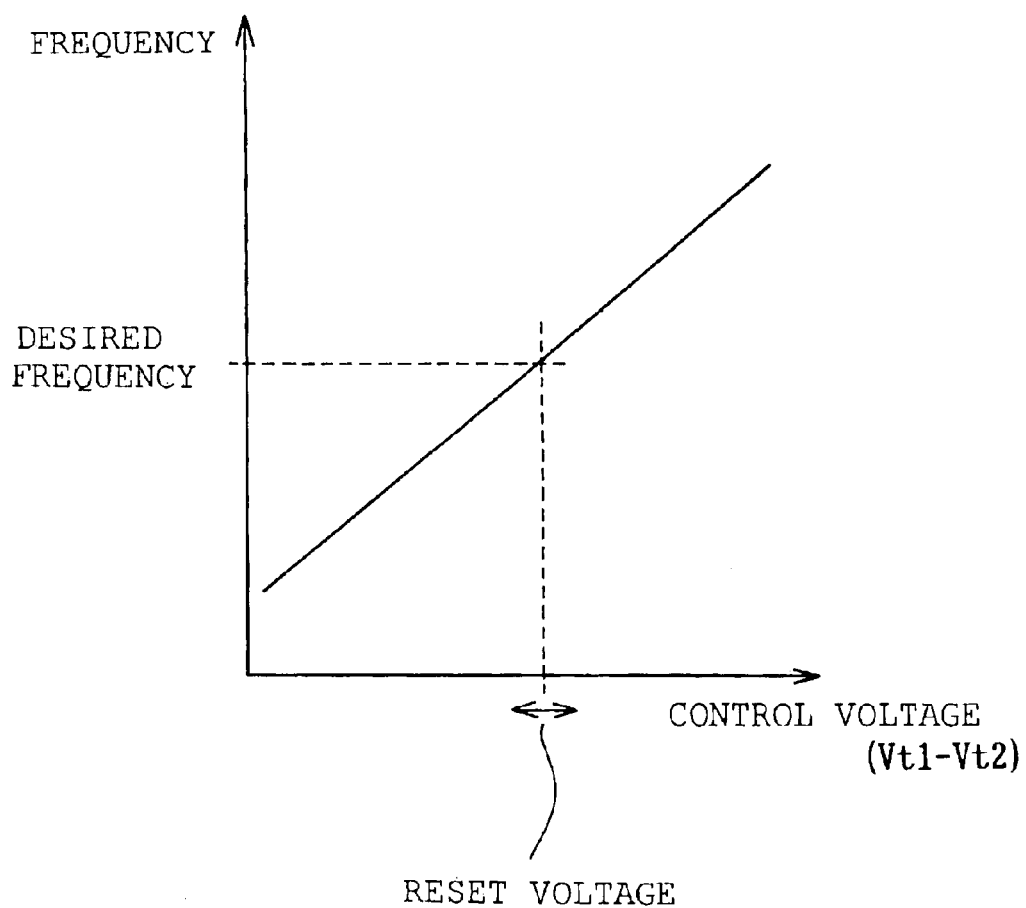
FIG. 18 is a chart illustrating operations of the PLL circuit according to one of the embodiments of the present invention.

A reference voltage difference may be inputted rather than supplying the reference bias voltage to the $V_{t1}$ and $V_{t2}$ lines. FIG. 17 shows such an example. In a reset circuit 93' in the PLL circuit shown in FIG. 17, a power source 85' is connected to the $V_{t1}$ line via a switch 83'. A power source 85'' is connected to the $V_{t2}$ line via a switch 84'. The voltages at the power sources 85' and 85'' are adjusted so that the difference (reset voltage) between these voltages corresponds to a desired frequency (see FIG. 18). The relationship between voltage difference and frequency shown in FIG. 18 can be obtained through preliminary measurements. By turning on the switches 83' and 84' using a predetermined timing, the oscillation frequency of the voltage-controlled oscillator 50 can be set to be closer to the desired frequency. As a result, it is possible to shorten the convergence time of the PLL circuit.

(Embodiment 5)

Figure 6:
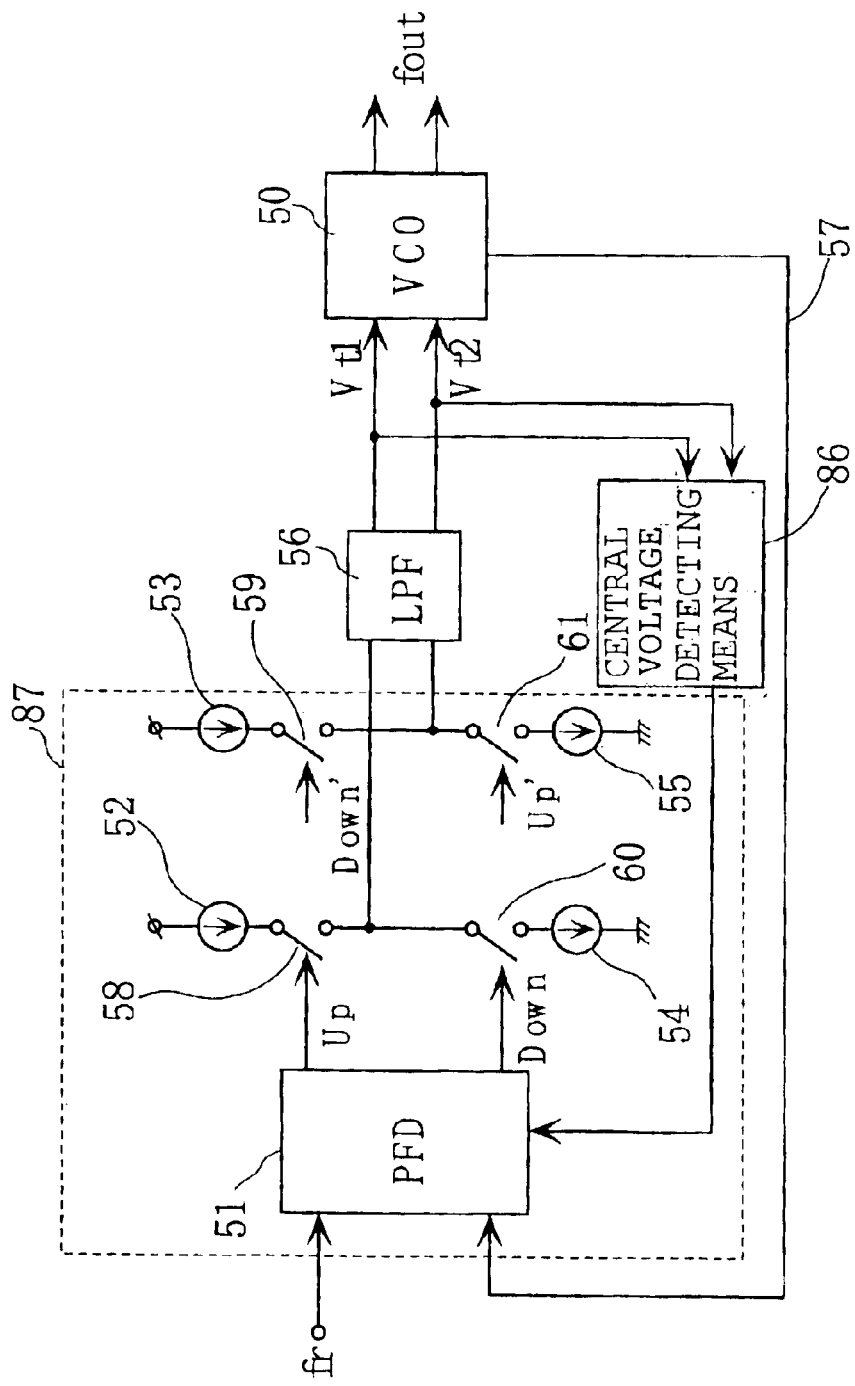
FIG. 6 is a circuit diagram showing a configuration of a PLL circuit according to Embodiment 5 of the present invention.

FIG. 6 shows a configuration of a PLL circuit according to Embodiment of the present invention. The configuration of the PLL circuit of the fifth embodiment differs from the configuration of the PLL circuit described in FIG. 3 in that central voltage detecting means 86 is provided to detect the central value between the voltages across the $V_{t1}$ and $V_{t2}$ lines. The other components of the PLL circuit of the present embodiment are similar to those of the PLL circuit shown in FIG. 3. The same components are denoted by the same reference numerals and their description is omitted.

The PLL circuit shown in FIG. 6 is configured so that an input of the central voltage detecting means 86 is connected to the $V_{t1}$ and $V_{t2}$ lines, which are the outputs of the loop filter 56. Connections in this circuit are such that outputs from the central voltage detecting means 86 are fed back to the phase frequency comparator 51.

In this PLL circuit, the central voltage detecting means 86 detects the voltages across the $V_{t1}$ and $V_{t2}$ lines and calculates the average of these voltages as a central voltage. The calculated central voltage is transmitted to the phase frequency comparator 51. The phase frequency comparator 51 compares the central voltage transmitted by the central voltage detecting means 86 with a charging supply voltage connected to the constant current circuit 52 or constant current circuit 53.

Figure 19:
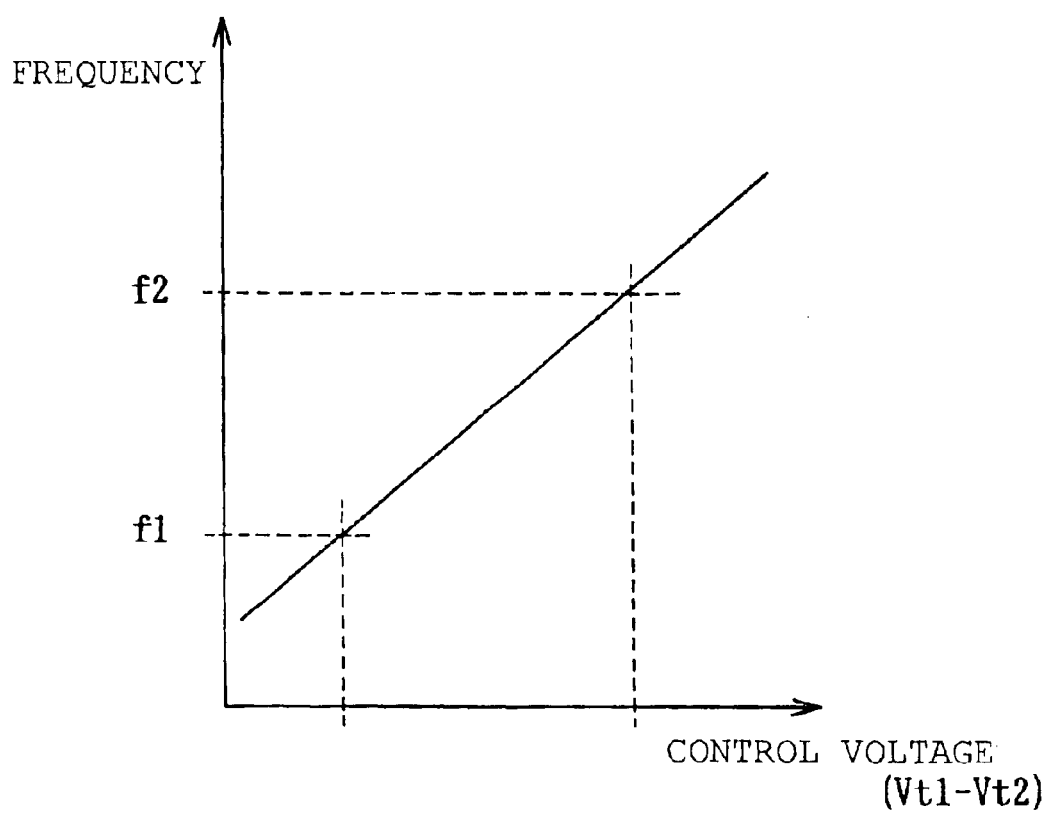
FIG. 19 is a chart illustrating operations of the PLL circuit according to one of the embodiments of the present invention.

In this case, the central voltage deviates over time unless the charge and discharge characteristics of the charge pump 87 are completely balanced. For example, it is assumed that the voltage-controlled oscillator 50 has the oscillation frequency characteristic shown in FIG. 19 with respect to a voltage difference in control voltage ($V_{t1}-V_{t2}$) and that the oscillation frequency is to be changed from f1 to f2. In this case, if the central voltage deviates upward (toward the supply voltage shown in FIG. 8(A)), $V_{t1}$ becomes equal to the supply voltage at a certain point on time. Subsequently, the required voltage difference cannot be obtained using the two control voltages $V_{t1}$ and $Vt_2$.

Figure 8:
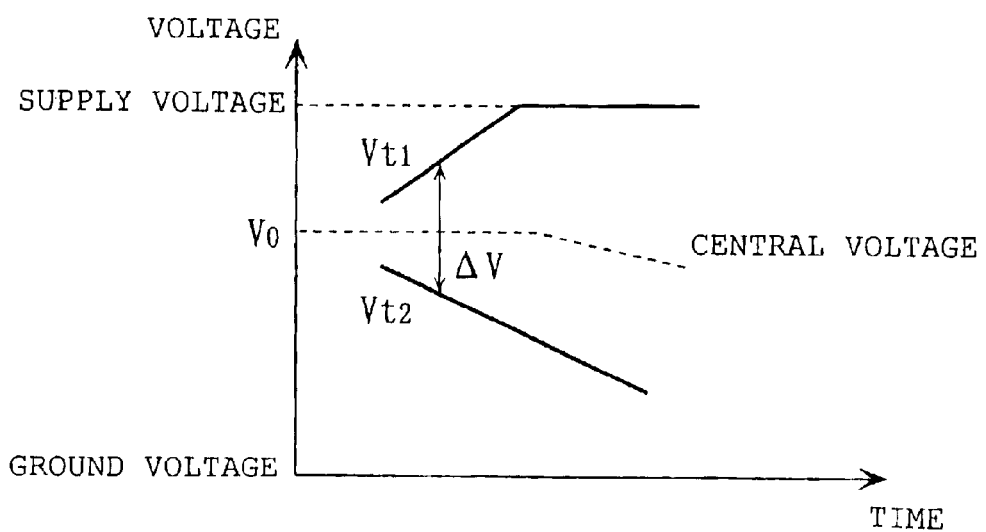
FIG. 8 is a chart illustrating operations of the PLL circuit according to Embodiment 5 of the present invention.
Figure 8:
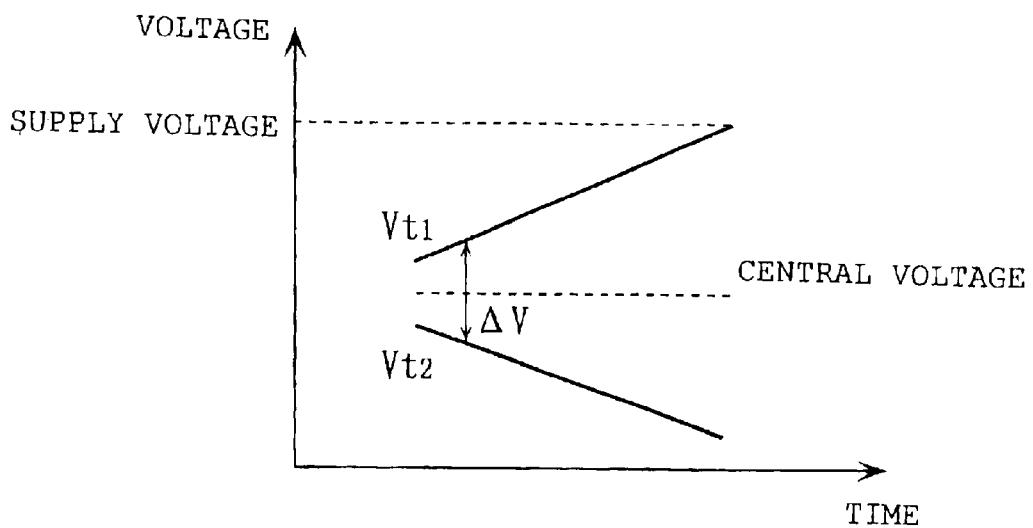
Figure 9:
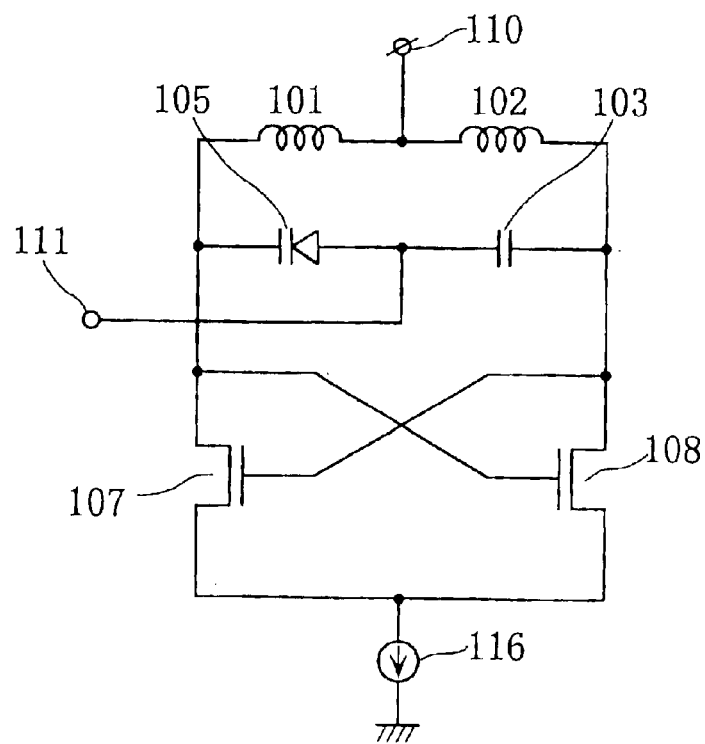
FIG. 9 is a circuit diagram showing a configuration of a conventional voltage-controlled oscillator.
Figure 10:
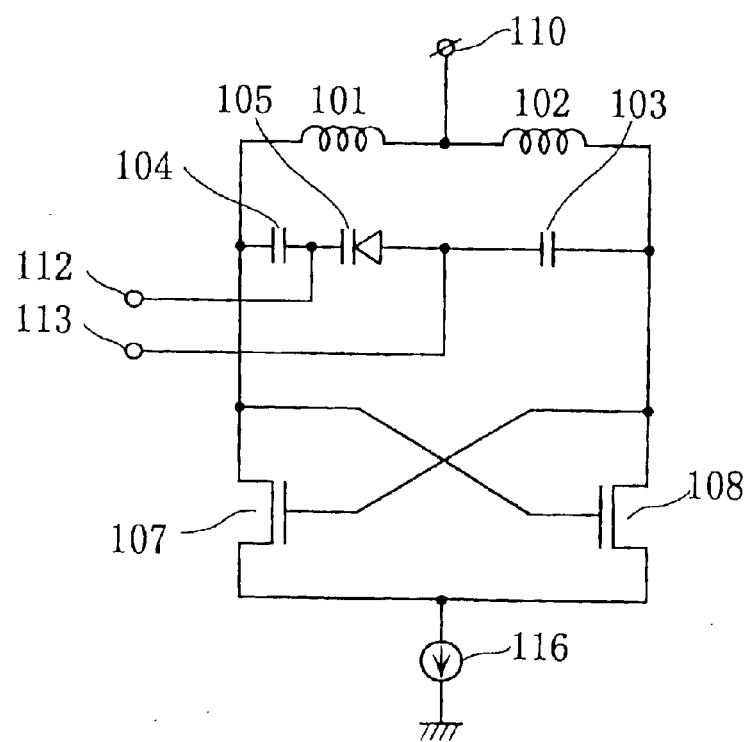
FIG. 10 is a circuit diagram showing a configuration of a conventional voltage-controlled oscillator.
Figure 11:
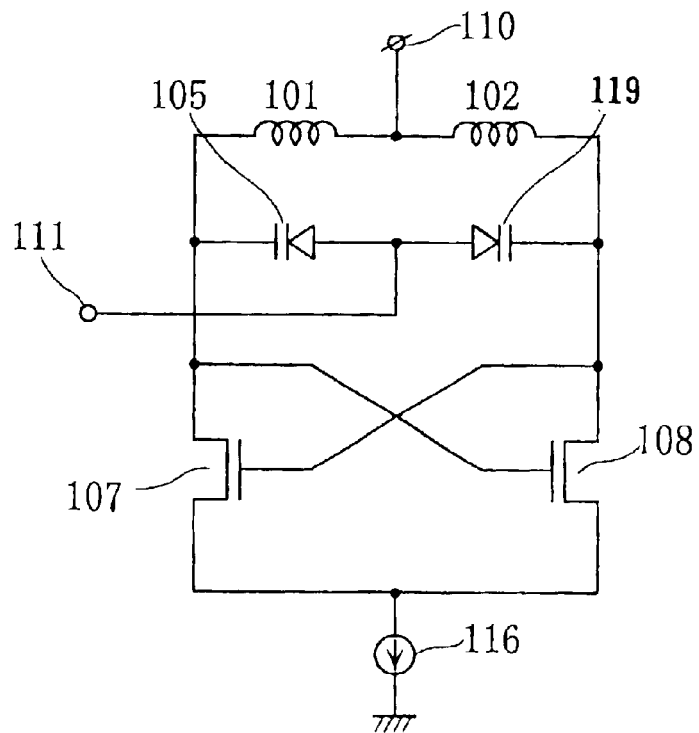
FIG. 11 is a circuit diagram showing a configuration of a conventional voltage-controlled oscillator.
Figure 12:
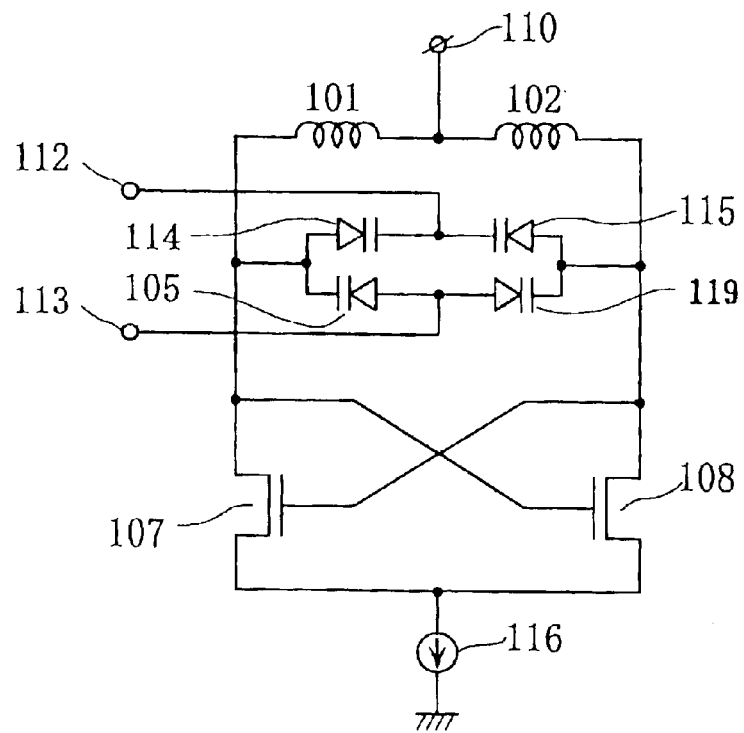
FIG. 12 is a circuit diagram showing a configuration of a conventional voltage-controlled oscillator.
Figure 13:
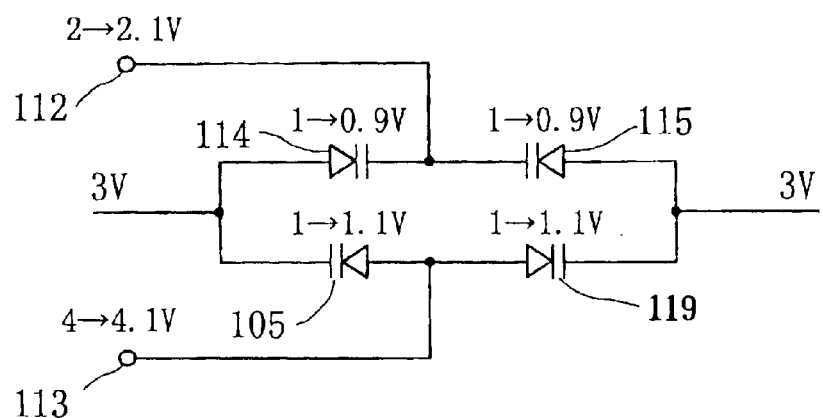
FIG. 13 is a circuit diagram showing a part of a configuration of a conventional voltage-controlled oscillator.
Figure 14:
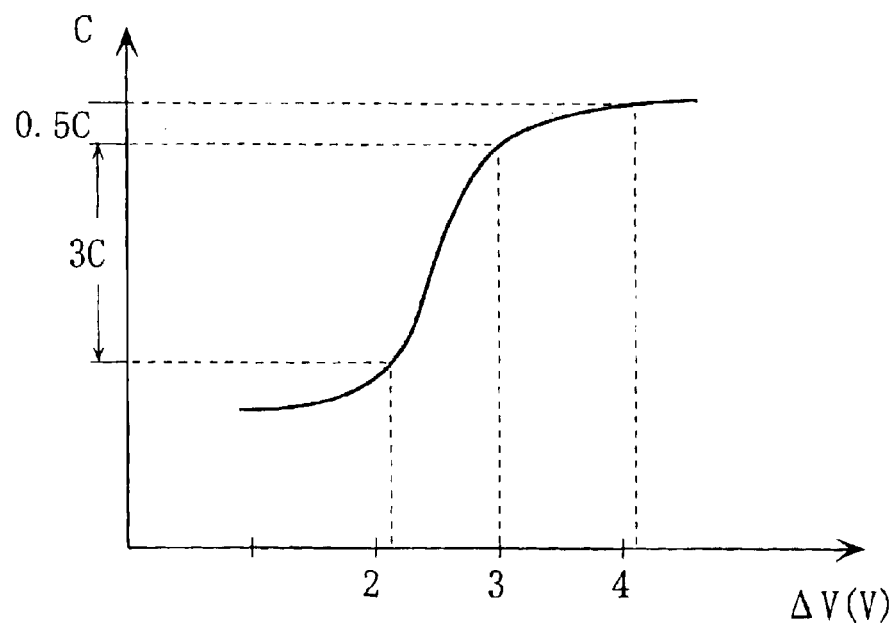
FIG. 14 is a chart illustrating operations of a conventional voltage-controlled oscillator.

Once the central voltage reaches a predetermined value (for example, $V_0$, shown in FIG. 8(A)), the phase frequency comparator 51 turns on the switches 60 and 61 for a predetermined time. Then, the central voltage decreases as shown in FIG. 8(B), so that the oscillation frequency of the voltage-controlled oscillator 50 can be stably controlled.

In contrast, once the central voltage reaches a predetermined value close to a ground voltage, the phase frequency comparator 51 turns on the switches 58 ands 59 for a predetermined time to increase the central voltage.

In the above description, once the central voltage reaches a value close to the supply voltage, the switches 60 and 61 are turned on to reduce the central voltage. However, a possible decrease in central voltage (shown in FIG. 8(A)) may be detected to turn on the switches 60 and 61 to reduce the central voltage. Further, rather than turning on the switches 58 and 59 to increase the central voltage when the latter reaches a predetermined value close to the ground voltage, a possible increase in the central voltage may be detected to turn on the switches 60 and 61 to increase the central voltage.

In the above description, the inductive impedance element according to the present invention is a coil. However, it is not limited to the coil but may be, for example, a strip line or any other component having an inductive impedance. Also in this configuration, effects similar to those described above are produced.

Further, in the above description, outputs from the voltage-controlled oscillator 50 are fed back to the charge pump 87, which then controls the frequency of the voltage-controlled oscillator 50. However, an XOR comparator may be used to control the frequency of the voltage-controlled oscillator 50.

Figure 7:
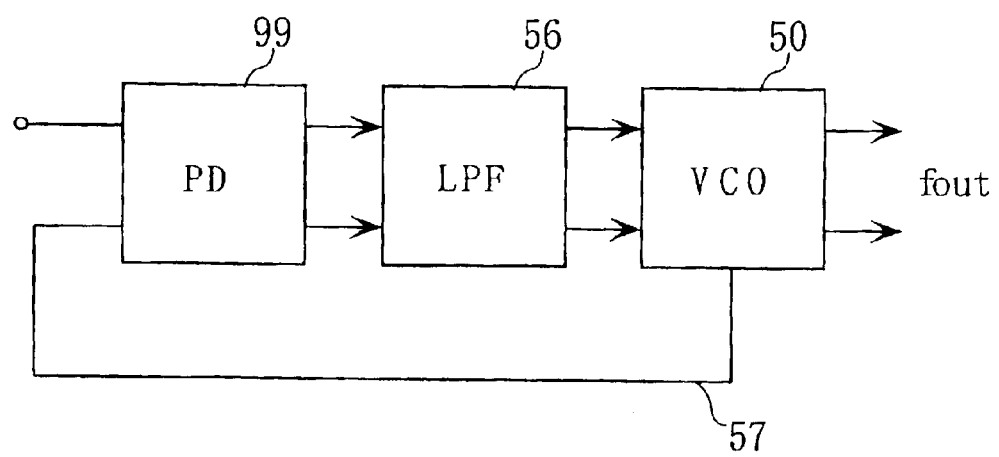
FIG. 7 is a circuit diagram showing another example of the configuration of the PLL circuit according to Embodiment 5 of the present invention.

FIG. 7 shows a configuration of the corresponding PLL circuit. In the PLL circuit shown in FIG. 7 has a phase comparator 99 as an example of phase comparing means according to the present invention, in place of the charge pump 87, shown in FIG. 6. The phase comparator 99 outputs two voltage outputs including an exclusive OR (XOR) of an inputted reference signal and a signal fed back from the output of the voltage-controlled oscillator 50, as well as a signal (XNOR) obtained by reversing the exclusive OR. With such a PLL circuit using the phase comparator 99, two output voltages are determined from the result of calculation of the two input signals. Consequently, the central voltage between the output signals is stabilized, thus providing a PLL circuit operating stably.

The PLL circuit shown in FIG. 7 may employ the reset circuits 93 and 93', described above.

In the above description, the first, second, third, and fourth capacitive impedance elements according to the present invention are capacitors. However, they are not limited to the capacitors but may be strip lines or the like or any other components having a capacitive impedance. Also in this case, effects similar to those described above are produced.

Further, in the above description, the $V_{r1}$ line is connected to the first terminal of each varactor, whereas the $V_{r2}$ line is connected to its second terminal. The $V_{r2}$ line may be connected to the first terminal of each varactor, while the $V_{r2}$ line may be connected to its second terminal. Also in this case, effects similar to those described above are produced.

Furthermore, in the above description, each varactor is produced by short-circuiting the drain and source of the MOSFET formed by the CMOS process. However, the varactor may be produced by a different method.

Moreover, in the above description, the variable capacitive impedance element has a directional parasitic capacitance to ground. However, another characteristic may be directional. Also in this case, this characteristic can be balanced in the circuit as a whole provided that the directionalities of the variable capacitive impedance elements are laid out symmetrically in the circuit as a whole.

Further, in the above description, the first, second, third, and fourth variable capacitive impedance elements according to the present invention are varactors. However, they may be any elements such as a PIN diode or the like provided that their electrostatic capacities can be varied by the voltage. Also in this case, effects similar to those described above are produced.

Furthermore, in the above description, the first, second, third, and fourth variable capacitive impedance elements according to the present invention can have their capacitance varied by voltage. However, these elements can have their capacitance varied by means other than voltage. They may have their capacitance controlled by, for example, a micromachine.

In this case, the micromachine has only to control the spacing between electrodes forming a capacitance. It is contemplated that, for example, to increase the capacitance, the micromachine, which is abutted against either electrode, push it to reduce the spacing between the electrodes. On the other hand, to reduce the capacitance, the micromachine pulls either electrode to increase the spacing between the electrodes. In this case, for example, in the PLL circuit shown in FIG. 3, if the phase of the oscillation signal is delayed compared to the phase of the reference signal, the phase frequency comparator 51, instead of outputting an up signal, abuts against the micromachine to exert an external force on it so that the micromachine pushes either of the electrodes. If the phase of the oscillation signal is advanced compared to the phase of the reference signal, the phase frequency comparator 51, instead of outputting a down signal, abuts against the micromachine to exert an external force on it so that the micromachine pulls either of the electrodes. Also in this case, effects similar to those described above are produced.

Figure 20:
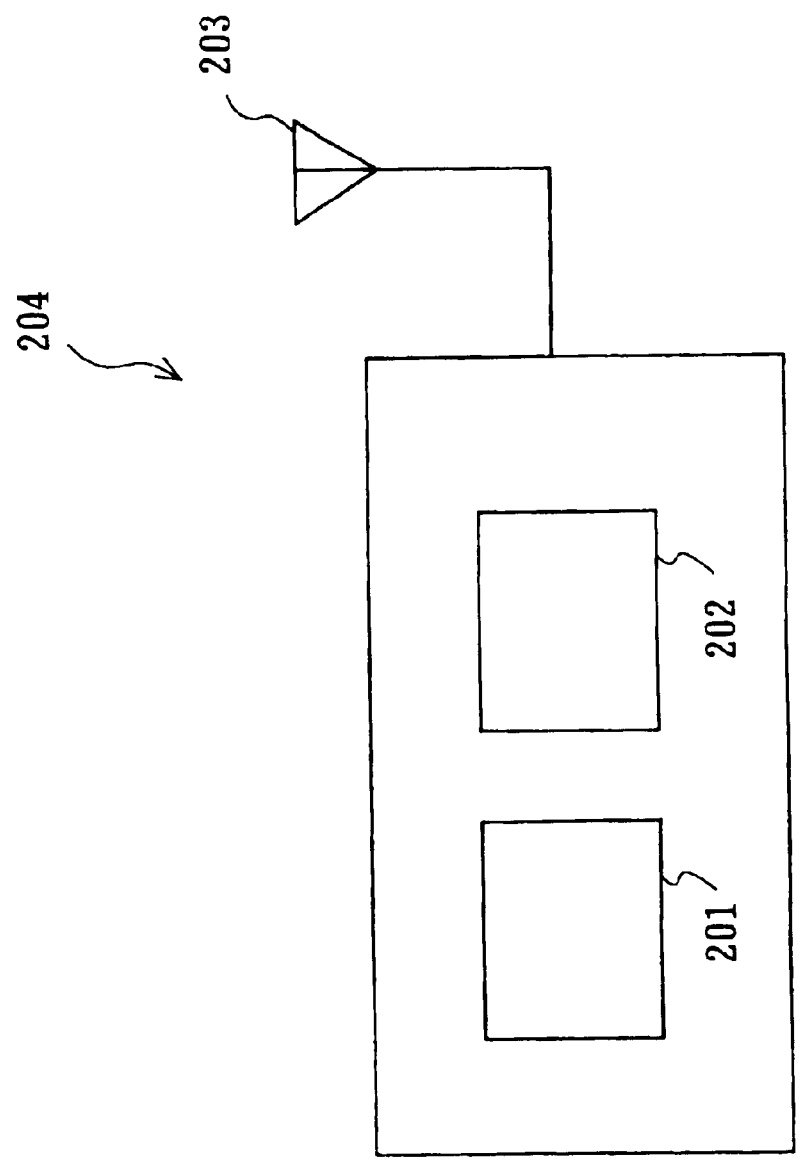
FIG. 20 is a block diagram showing a configuration of a communication equipment comprising the voltage-controlled oscillator according to one of the embodiments of the present invention or the PLL circuit according to one of the embodiments of the present invention.
Figure 21:
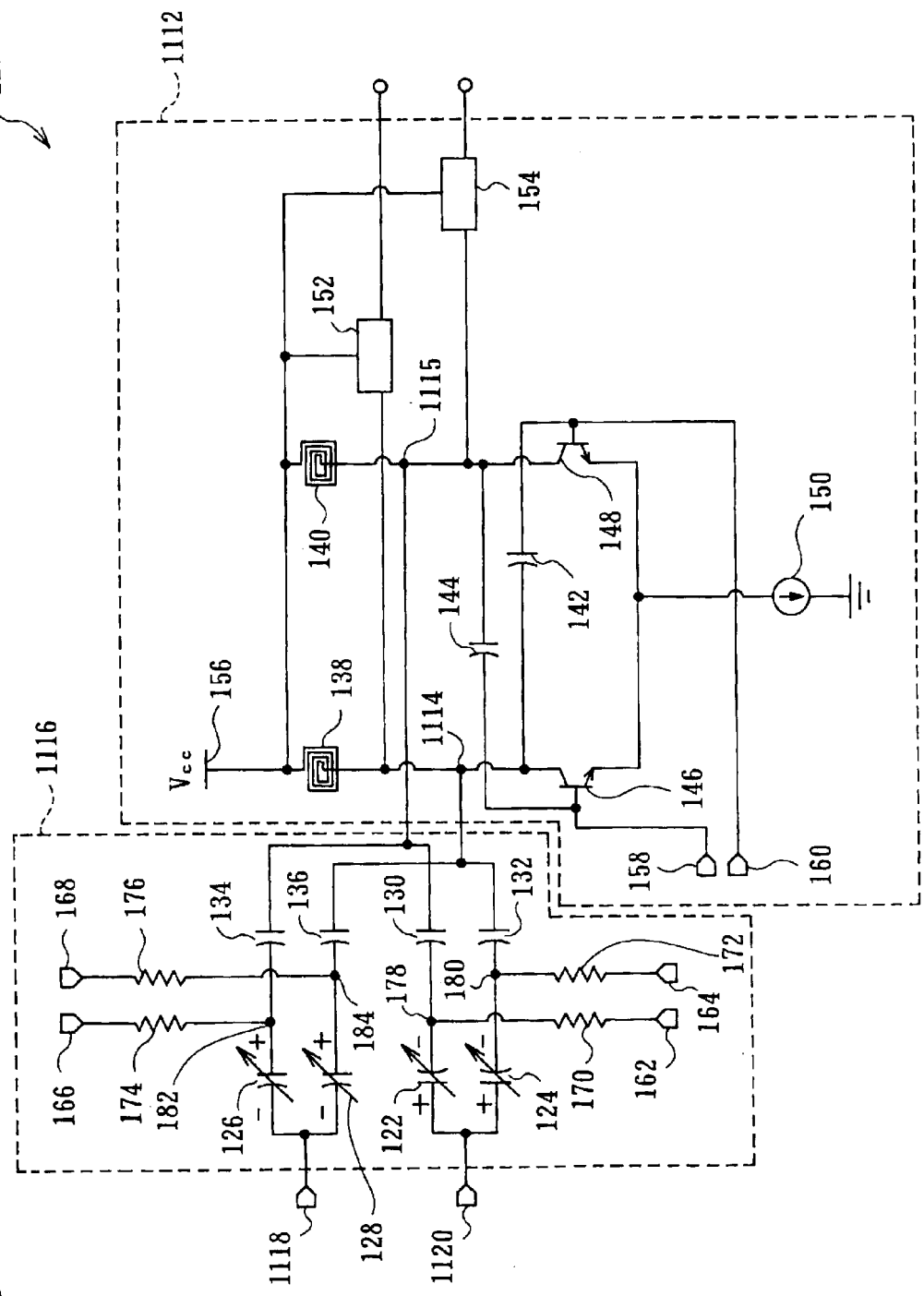
FIG. 21 is a circuit diagram showing a configuration of a conventional voltage-controlled oscillator.

Further, as shown in FIG. 20, the scope of the present invention includes communication equipment 204 in which a transmission circuit 201 or a reception circuit 202 is connected to an antenna 203, the transmission circuit 201 or reception circuit 202 having the oscillator or PLL circuit described above.

According to the present invention, an oscillator can be provided which can balance the characteristics of a circuit without being affected by noise from a signal line or a supply line, as well as a PLL circuit and an oscillating method that utilizes this oscillator.

Further, according to the present invention, an oscillator can be provided which can balance the characteristics of a circuit without being affected by noise from a signal line, a PLL circuit that utilizes this oscillator, or communication equipment or an oscillating method that utilizes this oscillator or PLL circuit.

What is claimed is:

1. An oscillator comprising a resonance circuit comprising:

a first series connected circuit having an inductive impedance element;

a second series connected circuit having a first capacitive impedance element, a first variable capacitive impedance element connected In series with said first capacitive impedance element and having a directional characteristic, and a second capacitive impedance element connected in series with said first variable capacitive impedance element; and a third series connected circuit having a third capacitive impedance element, a second variable capacitive impedance element connected in series with said third capacitive impedance element and having a directional characteristic, and a fourth capacitive impedance element connected in series with said second variable capacitive impedance element, and wherein said first series connected circuit, said second series connected circuit, and said third series connected circuit are connected in parallel, and said first variable capacitive impedance element and said second variable capacitive impedance element are oppositely connected with respect to either connection side of said second series connected circuit and said third series connected circuit, wherein variable capacities of said first variable capacitive impedance element and said second variable capacitive impedance element are externally controlled to be varied, and wherein the directional characteristic of said first variable capacitive impedance element and said second variable capacitive impedance element is a parasitic capacitance to around, and one or the terminals of each of said first and second variable capacitive impedance elements which has a larger parasitic capacitance to around is defined as a first terminal, while the other, which has a smaller parasitic capacitance to ground, is defined as a second terminal, and a first control voltage is applied to the first terminal of each of said first and second variable capacitive impedance elements, while a second control voltage is applied to the second terminal of each of said first and second variable capacitive impedance elements, said first control voltage and said second control voltage being adjusted to determine an oscillation frequency.

2. The oscillator according to claim 1, wherein said variable capacitive impedance element utilizes a gate capacity of a MOS transistor formed by a CMOS process.

3. A PLL circuit comprising:
an oscillator according to claim 1;
a charge pump to which a reference signal and an oscillation signal outputted by said oscillator are inputted and by which two output voltages are outputted in accordance with a difference in phase between said reference signal and said oscillation signal; and
a loop filter which low pass filters the two output voltages outputted by said charge pump, and
wherein, two outputs of said loop filter are connected to said oscillator so as to apply said first control voltage and said second control voltage to said oscillator.

4. A PLL circuit comprising:
an oscillator according to claim 1;
phase comparison means to which a reference signal and an oscillation signal outputted by said oscillator are inputted and by which two output voltages are outputted as an exclusive OR (XOR) of said reference signal and said oscillation signal and as a signal (XNOR) obtained by reversing said exclusive OR; and
a loop filter which low pass filters the two output voltages, and
two outputs of said loop filter are connected to said oscillator so as to apply said first control voltage and said second control voltage to said oscillator.

5. The PLL circuit according to claim 3 or 4, wherein one of the ends of each of a first and second switches is connected to a corresponding one of the two outputs of said loop filter, and the other end of each of said first and second switches is connected to a DC power source having a predetermined voltage.

6. The PLL circuit according to claim 3 or 4, wherein a reference voltage difference corresponding to a desired oscillation frequency is inputted to said oscillator using a desired timing.

7. The PLL circuit according to claim 3, wherein central voltage detecting means is connected to the two outputs of said loop filter to detect a central voltage between said first control voltage and said second control voltage, and a central voltage detection signal outputted by said central voltage detecting means is fed back to said charge pump.

8. The PLL circuit according to claim 3 or 4, wherein said loop filter has a first input terminal and a second input terminal to which the respective output voltages outputted by the charge pump are inputted, and a first output terminal and a second output terminal used to output said first control voltage and said second control voltage, respectively, to said oscillator, and is configured so that an impedance from said first input terminal to said first output terminal is equal to an impedance from said second input terminal to said second output terminal, an impedance from said first input terminal to said second output terminal is equal to an impedance from said second input terminal to said first output terminal, and a floating capacity of the whole loop filter is balanced.

9. Communication equipment comprising a transmission circuit, a reception circuit, and an antenna, wherein said transmission and/or reception circuit has an oscillator according to claim 1 or a PLL circuit according to claim 3 or 4.

10. An oscillator comprising a resonance circuit comprising:
a first series connected circuit having an inductive Impedance element;
a second series connected circuit having a first capacitive impedance element, a first variable capacitive impedance element connected in series with said first capacitive impedance element and having a predetermined directional characteristic, a second variable capacitive impedance element connected in series with and opposite said first variable capacitive impedance element, and a second capacitive impedance element connected in series with said second variable capacitive impedance element; and
a third series connected circuit having a third capacitive impedance element, a third variable capacitive impedance element connected in series with said third capacitive impedance element and having a predetermined directional characteristic, a fourth variable capacitive impedance element connected in series with and opposite said third variable capacitive impedance element, and a fourth capacitive impedance element connected in series with said fourth variable capacitive impedance element, and
wherein said first series connected circuit, said second series connected circuit, and said third series connected circuit are connected in parallel, and said second variable capacitive impedance element and said fourth variable capacitive impedance element are oppositely connected with respect to either connection side of said second series connected circuit and said third series connected circuit, and
wherein one of the terminals of each of said first, second, third, and fourth variable capacitive impedance elements which has a larger value of said predetermined characteristic, is defined as a first terminal while the other, which has a smaller value of said predetermined characteristic, is defined as a second terminal, a first control voltage is applied to the first terminal of each of said first, second, third, and fourth variable capacitive impedance elements, while a second control voltage is applied to the second terminal of each of said first, second, third, and fourth variable capacitive impedance elements, said first control voltage and said second control voltage being adjusted to determine an oscillation frequency.

11. The oscillator according to claim 10, wherein the value of said predetermined characteristic is a parasitic capacitance to ground.

12. An oscillating method using an oscillation circuit comprising a resonance circuit comprising:
a first series connected circuit having an inductive impedance element;
a second series connected circuit having a first capacitive impedance element, a first variable capacitive impedance element connected in series with said first capacitive impedance element and having a directional characteristic, and a second capacitive impedance element connected in series with said first variable capacitive impedance element; and
a third series connected circuit having a third capacitive impedance element, a second variable capacitive impedance element connected in series with said third capacitive impedance element and having a directional characteristic, and a fourth capacitive impedance element connected in series with said second variable capacitive impedance element, and wherein said first series connected circuit, said second series connected circuit, and said third series connected circuit are connected in parallel, and said first variable capacitive impedance element and said second variable capacitive impedance element are oppositely connected with respect to either connection side of said second series connected circuit and said third series connected circuit, wherein variable capacities of said first variable capacitive impedance element and said second variable capacitive impedance element are externally controlled to be varied, and wherein the directional characteristic of said first variable capacitive impedance element and said second variable capacitive impedance element is a parasitic capacitance to ground, and one of the terminals of each of said first and second variable capacitive impedance elements which has a larger parasitic capacitance to ground is defined as a first terminal, while the other, which has a smaller parasitic capacitance to ground, is defined as a second terminal, and a first control voltage is applied to the first terminal of each of said first and second variable capacitive impedance elements, while a second control voltage is applied to the second terminal of each of said first and second variable capacitive impedance elements, said first control voltage and said second control voltage being adjusted to determine an oscillation frequency.

* * * * *

UNITED STATES PATENT AND TRADEMARK OFFICE
CERTIFICATE OF CORRECTION

PATENT NO. : 6,930,562 B2
DATED : August 16, 2005
INVENTOR(S) : Koji Takinami et al.

It is certified that error appears in the above-identified patent and that said Letters Patent is hereby corrected as shown below:

Title page,
Item [57], ABSTRACT,
Line 2, "provides," should read -- provided --.

Column 16,
Line 29, change "In" to -- in --.
Lines 56 and 58, change "around" to -- ground --.
Line 56, change "or" to -- of --.

Signed and Sealed this

Third Day of January, 2006

JON W. DUDAS
*Director of the United States Patent and Trademark Office*